US007899562B2

(12) United States Patent
Pannese et al.

(10) Patent No.: US 7,899,562 B2
(45) Date of Patent: Mar. 1, 2011

(54) METHODS AND SYSTEMS FOR CONTROLLING A SEMICONDUCTOR FABRICATION PROCESS

(75) Inventors: Patrick D. Pannese, Lynnfield, MA (US); Vinaya Kavathekar, Cupertino, CA (US); Peter van der Meulen, Newburyport, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 531 days.

(21) Appl. No.: 11/877,242

(22) Filed: Oct. 23, 2007

(65) Prior Publication Data

US 2008/0155449 A1 Jun. 26, 2008

Related U.S. Application Data

(63) Continuation of application No. 11/743,105, filed on May 1, 2007, now abandoned, and a continuation-in-part of application No. 10/985,834, filed on Nov. 10, 2004, now Pat. No. 7,458,763, said application No. 11/743,105 is a continuation-in-part of application No. 11/123,966, filed on May 6, 2005, now abandoned, and a continuation-in-part of application No. 11/302,563, filed on Dec. 13, 2005.

(60) Provisional application No. 60/746,163, filed on May 1, 2006, provisional application No. 60/807,189, filed on Jul. 12, 2006, provisional application No. 60/518,823, filed on Nov. 10, 2003, provisional application No. 60/607,649, filed on Sep. 7, 2004.

(51) Int. Cl.
*G06F 19/00* (2006.01)
*G05D 19/00* (2006.01)
(52) U.S. Cl. .......................... 700/48; 700/112; 700/116
(58) Field of Classification Search .................. 700/48, 700/112, 116
See application file for complete search history.

(56) References Cited

U.S. PATENT DOCUMENTS

| | | | | |
|---|---|---|---|---|
| 6,110,214 A | * | 8/2000 | Klimasauskas | 703/2 |
| 6,215,498 B1 | * | 4/2001 | Filo et al. | 345/419 |
| 6,246,972 B1 | * | 6/2001 | Klimasauskas | 703/2 |
| 6,400,996 B1 | * | 6/2002 | Hoffberg et al. | 700/83 |
| 6,738,682 B1 | * | 5/2004 | Pasadyn | 700/100 |
| 2003/0091409 A1 | * | 5/2003 | Danna et al. | 414/217 |
| 2005/0111938 A1 | * | 5/2005 | van der Meulen | 414/217 |
| 2006/0036559 A1 | * | 2/2006 | Nugent | 706/23 |
| 2009/0021514 A1 | * | 1/2009 | Klusza | 345/419 |

* cited by examiner

*Primary Examiner*—Michael D Masinick
(74) *Attorney, Agent, or Firm*—Perman & Green, LLP; Richard Pickreign

(57) ABSTRACT

Software for controlling processes in a heterogeneous semiconductor manufacturing environment may include a wafer-centric database, a real-time scheduler using a neural network, and a graphical user interface displaying simulated operation of the system. These features may be employed alone or in combination to offer improved usability and computational efficiency for real time control and monitoring of a semiconductor manufacturing process. More generally, these techniques may be usefully employed in a variety of real time control systems, particularly systems requiring complex scheduling decisions or heterogeneous systems constructed of hardware from numerous independent vendors.

19 Claims, 13 Drawing Sheets

METHODS AND SYSTEMS FOR CONTROLLING A SEMICONDUCTOR FABRICATION PROCESS

CROSS-REFERENCE TO RELATED APPLICATIONS

This claims the benefit of U.S. App. No. 60/746,163 filed on May 1, 2006 and U.S. App. No. 60/807,189 filed on Jul. 12, 2006. This application is a continuation-in-part of U.S. application Ser. No. 10/985,834, filed on Nov. 10, 2004, which claims the benefit of U.S. App. No. 60/518,823 filed on Nov. 10, 2003 and U.S. App. No. 60/607,649 filed on Sep. 7, 2004. This application is also a continuation-in-part of U.S. application Ser. No. 11/123,966 filed on May 6, 2005, and a continuation-in-part of U.S. application Ser. No. 11/302,563 filed on Dec. 13, 2005.

Each of the foregoing commonly-owned applications is incorporated by reference herein in its entirety.

BACKGROUND

1. Field

This invention relates to, inter alia, methods of utilizing a wafer-centric database to improve system throughput.

2. Related Art

The handling of workpieces such as wafers within a semiconductor manufacturing environment can present significant computing challenges. Hardware such as process modules, handlers, valves, robots, and other equipment are commonly assembled from a variety of different manufacturers each of which may provide proprietary or pre-compiled software unsuitable for a newly conceived process. In addition, fabrication-wide software typically compiles relevant data as simple, chronological logs of output from sensors, process modules, controllers, and the like, so that finding information for handler or wafer-specific processing requires an initial search of all of the potentially relevant log files for data, followed by processing the search results into a form suitable for process control such as scheduling decisions.

There remains a need for improved software suitable for real-time control of semiconductor manufacturing processes.

SUMMARY OF THE INVENTION

Software for controlling processes in a heterogeneous semiconductor manufacturing environment may include a wafer-centric database, a real-time scheduler using a neural network, and a graphical user interface displaying simulated operation of the system. These features may be employed alone or in combination to offer improved usability and computational efficiency for real time control and monitoring of a semiconductor manufacturing process. More generally, these techniques may be usefully employed in a variety of real time control systems, particularly systems requiring complex scheduling decisions or heterogeneous systems constructed of hardware from numerous independent vendors.

In one aspect, a user interface disclosed herein includes a display of a three-dimensional simulation of a semiconductor workpiece handling system that includes a hardware item; and a link to information related to the hardware item, wherein the link may be substantially contained within an area of the display where the hardware item resides, and wherein the information may include at least a status of the hardware item and technical information for the hardware item.

The three-dimensional simulation may be a real-time simulation based upon operation of a physical semiconductor workpiece handling system. The semiconductor workpiece handling system may include a plurality of hardware items, each one of the plurality of hardware items may have a link to information associated therewith. The technical information may include a list of replacement parts for the hardware item. The technical information may include a manual for the hardware item. The technical information may include a maintenance log for the hardware item. The link may be activated by a mouse over of the link. The link may be activated by a mouse click of the link. The information may be displayed in a new window upon activation of the link. The information may be displayed in a pop-up window upon activation of the link. The status information may include sensor data received from the hardware item. The status information may include diagnostic information for the hardware item. The diagnostic information may include one or more of a performance evaluation, an expected time to failure, a maintenance alert, and an operating condition alert. The hardware item may include one or more of a robotic arm, an end effector, an isolation valve, a heating station, a cooling station, a load lock, a vacuum pump, a robot drive, a metrology device, a sensor, a process module, and a device within a process module. The hardware item may include a workpiece. The workpiece may include a semiconductor wafer. The status information may include a particle map. The status information may include an estimated temperature. The status information may include a wafer center location. The status information may include substantially real time data for the hardware item. The display may include a tool for user selection of a perspective for viewing the three-dimensional simulation.

In one aspect, a system disclosed herein includes a state machine that controls operation of a semiconductor manufacturing system that may schedule processing of one or more workpieces, the state machine may include a plurality of states associated by a plurality of transitions, each one of the plurality of transitions may have a weight assigned thereto, wherein when the state machine is operating within one of the plurality of states, a selection of a transition from the one of the plurality of states to another one of the plurality of states may be determined by evaluating the weight assigned to each one of a number of possible transitions from the one of the plurality of states; and a neural network that may receive as inputs data from the semiconductor manufacturing system and may provide as outputs the weights for one or more of the plurality of transitions.

At least one of the states may represent a state of an item of hardware within the semiconductor manufacturing system. At least one of the states may represent a position of a workpiece within the semiconductor manufacturing system. At least one of the states may represent a position of an isolation valve within the system. The neural network may be updated in substantially real time. The neural network may be updated every 20 milliseconds. The inputs to the neural network may include one or more of sensor data, temperature data, a detected workpiece position, an estimated workpiece temperature, an actual workpiece temperature, a valve state, an isolation valve state, robotic drive encoder data, robotic arm position data, end effector height data, a process time, a process status, a pick time, a place time, and a control signal. The inputs to the neural network may include at least one process time for a workpiece within the semiconductor manufacturing system. The at least one process time may include one or more of a target duration, a start time, an end time, and an estimated end time. The inputs may include a transition time. The transition time may include one or more of a pump down to vacuum time and a vent to atmosphere time. At least one of the states may include a transition to itself. The state machine may be updated in substantially real time. The state machine may be updated every 20 milliseconds. The system may also further include a plurality of state machines, each one of the plurality of state machines may control a portion of the semiconductor manufacturing system according to one of a plurality of neural networks.

In one aspect, a computer program product disclosed herein includes computer executable code embodied in a computer readable medium that, when executing on one or more computing devices, performs the steps of: controlling operation of a semiconductor manufacturing system with a state machine to schedule processing of one or more workpieces, the state machine may include a plurality of states associated by a plurality of transitions, each one of the plurality of transitions may have a weight assigned thereto; receiving data from the semiconductor manufacturing system; calculating the weight assigned to each one of a number of possible transitions from a current state of the plurality of states by applying the data as inputs to a neural network; and selecting a transition from the current state of the plurality of states by evaluating the weight assigned to each one of the number of possible transitions from the current state.

At least one of the plurality of states may represent a state of an item of hardware within the semiconductor manufacturing system. At least one of the states may represent a position of a workpiece within the semiconductor manufacturing system. At least one of the states may represent a position of an isolation valve within the system. The computer executable code may further perform the step of updating the neural network in substantially real time. The computer executable code may further perform the step of updating the neural network every 20 milliseconds. The inputs to the neural network may include one or more of sensor data, temperature data, a detected workpiece position, an estimated workpiece temperature, an actual workpiece temperature, a valve state, an isolation valve state, robotic drive encoder data, robotic arm position data, end effector height data, a process time, a process status, a pick time, a place time, and a control signal. The inputs to the neural network may include at least one process time for a workpiece within the semiconductor manufacturing system. The at least one process time may include one or more of a target duration, a start time, an end time, and an estimated end time. The inputs may include a transition time. The transition time may include one or more of a pump down to vacuum time and a vent to atmosphere time. At least one of the states includes a transition to itself. The computer executable code may further perform the step of updating the state machine in substantially real time. The computer executable code may further perform the step of updating the state machine every 20 milliseconds. The computer executable code may further perform the step of controlling operation of a semiconductor manufacturing system with a plurality of state machines, each one of the plurality of state machines controlling a portion of the semiconductor manufacturing system according to one of a plurality of neural networks.

In one aspect, a method disclosed herein includes controlling operation of a semiconductor manufacturing system with a state machine to schedule processing of one or more workpieces, the state machine may include a plurality of states associated by a plurality of transitions, each one of the plurality of transitions may have a weight assigned thereto; receiving data from the semiconductor manufacturing system; calculating the weight assigned to each one of a number of possible transitions from a current state of the plurality of states by applying the data as inputs to a neural network; and selecting a transition from the current state of the plurality of states by evaluating the weight assigned to each one of the number of possible transitions from the current state.

At least one of the plurality of states may represent a state of an item of hardware within the semiconductor manufacturing system. At least one of the states may represent a position of a workpiece within the semiconductor manufacturing system. At least one of the states may represent a position of an isolation valve within the system. The computer executable code may further perform the step of updating the neural network in substantially real time. The computer executable code may further perform the step of updating the neural network every 20 milliseconds. The inputs to the neural network include one or more of sensor data, temperature data, a detected workpiece position, an estimated workpiece temperature, an actual workpiece temperature, a valve state, an isolation valve state, robotic drive encoder data, robotic arm position data, end effector height data, a process time, a process status, a pick time, a place time, an encoder position, a time remaining for a workpiece in a process module, a time remaining for a workpiece in a load lock, and a control signal. The inputs to the neural network may include at least one process time for a workpiece within the semiconductor manufacturing system. The at least one process time may include one or more of a target duration, a start time, an end time, and an estimated end time. The inputs may include a transition time. The transition time may include one or more of a pump down to vacuum time and a vent to atmosphere time. At least one of the states may include a transition to itself. The method may further include the step of updating the state machine in substantially real time. The method may further include the step of updating the state machine every 20 milliseconds. The method may further include the step of controlling operation of a semiconductor manufacturing system with a plurality of state machines, each one of the plurality of state machines may control a portion of the semiconductor manufacturing system according to one of a plurality of neural networks. The method may further include training the neural network to calculate weights for a desired workpiece processing schedule. The state machine may schedule concurrent processing of a plurality of workpieces.

In one aspect, a method disclosed herein includes connecting a plurality of nodes into a neural network, each one of the nodes represented by a programming object; defining a condition for converting one of the plurality of nodes into a second plurality of nodes; and when the condition is met, converting the one of the plurality of nodes into two or more nodes. The condition may include a processing constraint.

In one aspect, a system disclosed herein includes a semiconductor manufacturing system; a controller that controls processing of workpieces within the semiconductor manufacturing system, wherein the controller permits a selection of one or more of a plurality of scheduling techniques to control processing.

The plurality of scheduling techniques may include one or more of rule-based scheduling, route-based scheduling, state-based scheduling, and neural-network-based scheduling. The controller may provide an interface for user selection of the one or more of the plurality of scheduling techniques. The controller may select the one or more of the plurality of scheduling techniques according to a processing metric. The controller may employ at least two of the plurality of scheduling techniques concurrently.

In one aspect, a method disclosed herein includes creating a data structure for a workpiece, the data structure including an identity of the workpiece and one or more fields for storing information relating to the workpiece; processing the workpiece in a semiconductor manufacturing system; receiving data from the semiconductor manufacturing system relating to the processing of the workpiece; and storing the data in one of the one or more fields of the data structure.

The data structure may be an object oriented data structure. The data structure may be embodied in a relational database. The method may include creating a plurality of data structures for a plurality of workpieces. The data may include a measured property of the workpiece. The measured property may include a location of the workpiece. The measured property may include a process time for the workpiece. The measured property may include a temperature of the workpiece. The data may include a calculated property of the workpiece. The calculated property may include an estimated temperature of the workpiece. The method may include updating the estimated temperature according to a thermal model for the workpiece. The method may include storing a time at which the temperature was estimated. The workpiece may include a semiconductor wafer. The method may include providing data from a plurality of process modules for storage in the data structure. The method may include providing data from a robotic semiconductor wafer handler for storage in the data structure. The method may include storing a time in one of the one or more fields of the data structure. The method may include storing an attribute of the data in one of the one or more fields of the data structure. The attribute may identify a source of the data. The attribute may identify a time that the data was acquired. The method may include retrieving data from at least one of the one or more fields of the data structure and using the retrieved data to control processing of the workpiece. The data may include a recipe for processing the workpiece. The data may include a particle map for the workpiece that identifies a location of one or more particles on the workpiece. The data may include a process history for the workpiece.

In one aspect, a computer program product disclosed herein includes computer executable code embodied on a computer readable medium that, when executing on one or more computing devices, performs the steps of: creating a data structure for a workpiece, the data structure including an identity of the workpiece and one or more fields for storing information relating to the workpiece; receiving data from a semiconductor manufacturing system relating to processing of the workpiece while the workpiece is processed by the semiconductor manufacturing system; and storing the data in one of the one or more fields of the data structure.

The data structure may be an object oriented data structure. The data structure may be embodied in a relational database. The computer program product may include code the performs the step of creating a plurality of data structures for a plurality of workpieces. The data may include a measured property of the workpiece. The measured property may include a location of the workpiece. The measured property may include a process time of the workpiece. The measured property may include a temperature of the workpiece. The data may include a calculated property of the workpiece. The calculated property may include an estimated temperature of the workpiece. The computer program product may include code that performs the step of updating the estimated temperature according to a thermal model for the workpiece. The computer program product may include code that performs the step of storing a time of attaining the estimated temperature. The workpiece may include a semiconductor wafer. The semiconductor manufacturing system may include a plurality of process modules that provide data for storage in the data structure. The semiconductor manufacturing system may include a robotic semiconductor wafer handler that provides data for storage in the data structure. The computer program product may include code that performs the step of associating a time with the data in one of the one or more fields of the data structure. The computer program product may include code that performs the step of storing an attribute of the data in one of the one or more fields of the data structure. The attribute may identify a source of the data. The attribute may identify a time that the data was acquired. The computer program product may include code that performs the step of retrieving data from at least one of the one or more fields of the data structure and using the retrieved data to control processing of the workpiece. The data may include a recipe for processing the workpiece. The data may include a particle map for the workpiece that identifies a location of one or more particles on the workpiece. The data may include a process history for the workpiece.

In one aspect, a system disclosed herein includes a semiconductor manufacturing system; at least one program to control operation of the semiconductor manufacturing system to process a plurality of wafers, and to receive data from the semiconductor manufacturing system relating to one of the plurality of wafers; a database that maintains a data structure for each one of the plurality of wafers and stores the received data in the data structure corresponding to the related one of the plurality of wafers. The at least one program may include software to optimize throughput of the semiconductor manufacturing system according to wafer-specific data in the database.

In one aspect, a computer readable medium disclosed herein has stored thereon a data structure, the data structure may include: a first field uniquely identifying a wafer; a second field containing a measured value for the wafer during a fabrication process; a third field containing a calculated value for the wafer; and a forth field containing information about at least one process step to which the wafer has been exposed. The data structure may include a fifth field containing at least one prospective processing step for the wafer.

In one aspect, a system disclosed herein includes a semiconductor handling system including at least one robot and a plurality of process chambers; a software controller that controls operation of the handling system to process one or more workpieces; and an electronic interface that may include a shared medium that couples the at least one robot, the plurality of process chambers, and the controller in a communicating relationship.

The shared medium may include a daisy chain in which the at least one robot, the plurality of process chambers, and the controller share at least one wire. The shared medium may include a wireless network. The operation of the handling system may include controlling one or more slot valves. The operation of the handling system may include moving the one or more workpieces among the process chambers with the at least one robot. The operation of the handling system may include receiving sensor data from at least one of the plurality of process chambers.

In one aspect, a system disclosed herein includes a semiconductor handling system that may include at least one robot and a plurality of process chambers; at least one workpiece within the semiconductor handling system; a database that stores data for the at least one workpiece indexed according to a unique identifier for the at least one workpiece; a controller that controls operation of the semiconductor handling system, the controller may employ a neural network and a finite state machine to schedule handling of the at least one workpiece; and a graphical user interface that may display a real time three-dimensional view of the semiconductor handling system and the at least one workpiece.

BRIEF DESCRIPTION OF FIGURES

The foregoing and other objects and advantages of the invention will be appreciated more fully from the following further description thereof, with reference to the accompanying drawings wherein.

DETAILED DESCRIPTION

The systems and methods described herein relate to software for operating a semiconductor manufacturing system. While the following example embodiments are directed generally to semiconductor fabrication, it will be understood the that the principles disclosed herein have broader applicability, and may be usefully employed, for example, in any industrial control environment, particularly environments characterized by complex scheduling, control of robotic components, and/or real time processing based upon system states, sensor feedback, and the like.

Figure 1:
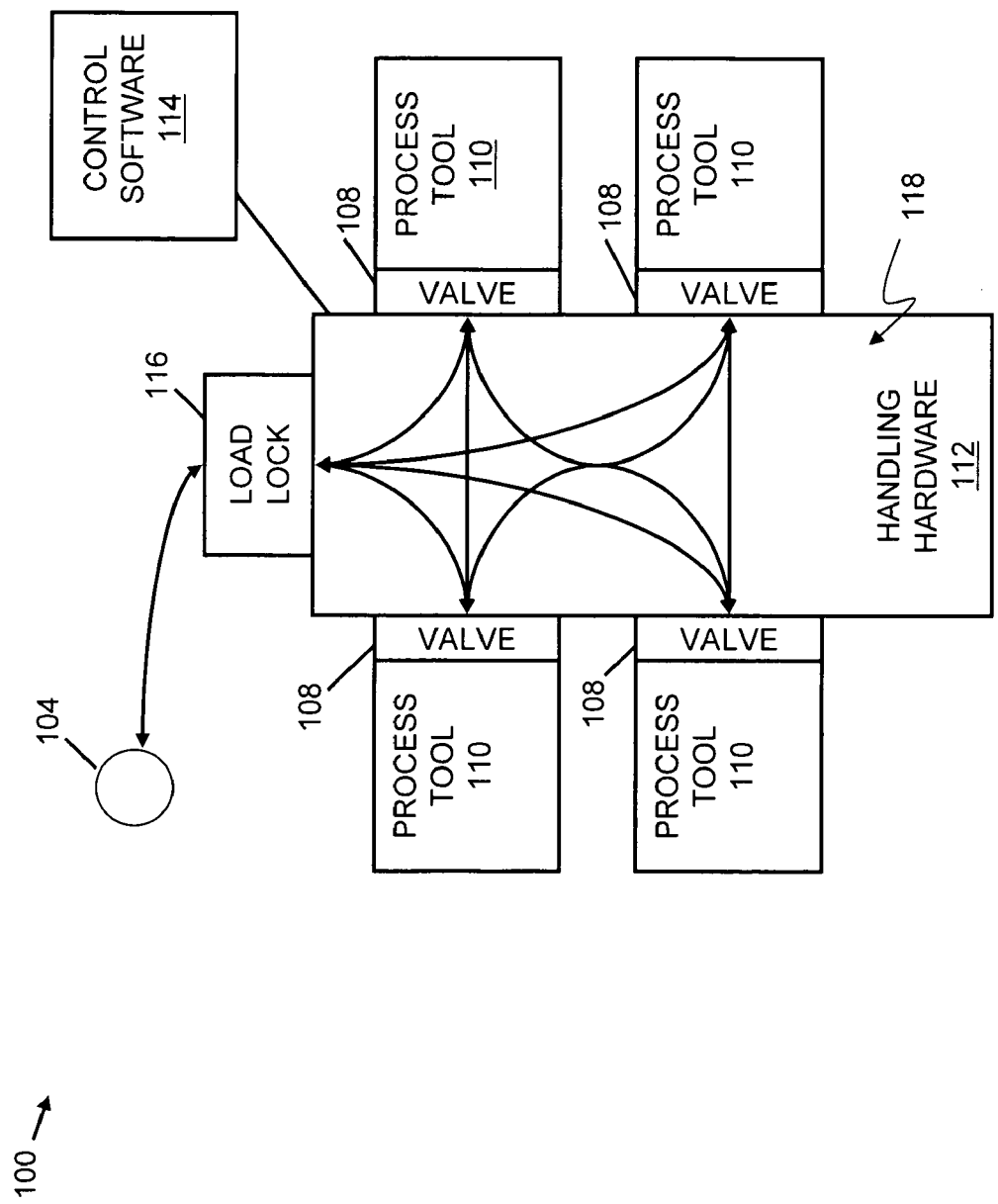
FIG. 1 shows a semiconductor processing system.

FIG. 1 shows a semiconductor processing system. The system 100 for processing a wafer 104 may include a plurality of valves 108, a plurality of process tools 110, handling hardware 112, control software 114, and a load lock 116. In general operation, the system 100 operates to receive a wafer 104 through the load lock 116, to move the wafer 104 among the process tools 110 with the handling hardware 112 so that the wafer 104 may be processed, and to remove the processed wafer 104 through the load lock 116.

The wafer 104 may be any wafer or other workpiece processed by the system 100. More generally, terms "wafer" and "workpiece" are used herein as a short hand for all substrates and other materials that might be handled by a semiconductor fabrication system. It will be understood that, while the following description is applicable to wafers, and refers specifically to wafers in a number of illustrative embodiments, a variety of other objects may be handled within a semiconductor facility including a production wafer, a test wafer, a cleaning wafer, a calibration wafer, or the like, as well as other substrates (such as for reticles, magnetic heads, flat panels, and the like), including substrates having various shapes such as square or rectangular substrates. In addition, a particular wafer-related operation may relate to a batch of wafers, which may be arranged horizontally within a plane, vertically stacked, or otherwise positioned for group handling, processing, and so forth. All such workpieces are intended to fall within the scope of the term "wafer" or "workpiece" as used herein unless a different meaning is explicitly provided or otherwise clear from the context.

The valves 108 may include slot valves or any other isolation valves or other hardware for isolating the environment of a process tool 110 from a shared vacuum environment of the system 100. Each valve 108 may be operable to selectively isolate one or more interior chambers.

The process tools 110 may include any tools or modules suitable for processing semiconductor wafers. For example, the process tools 110 may include any semiconductor process module or tool, including without limitation metrology tools, deposition tools, lithography tools, etching tools, coating tools, buffer stations, storage tools, inspection tools, heating/cooling stations, and so forth. The process tools 110 may also, or instead, include cluster tools with a number of different process tools arranged about a common wafer handler.

The handling hardware 112 may include one or more robotic arms, transport carts, elevators, transfer stations and the like, as well as combinations of these. In general, the handling hardware 112 operates to manipulate wafers 104 within the system 100, such as by moving a wafer 104 between two of the process tools 110, or to/from the load lock 116. While in certain instances, the handling hardware 112 may include a single robotic arm or transport cart, more complex combinations may be usefully employed, such as a number of robotic arms that hand off wafers along a line of process tools (either directly or via a transfer station), a number of robots that service a cart (such as a magnetically levitated cart or a cart on rails) for relatively long distance transport, and so forth. All such combinations that might be usefully employed to manipulate wafers and transfer wafers among process tools 110 are intended to fall within the scope of the handling hardware 112 described herein.

The control software 114 performs a variety of tasks associated with processing wafers 104 within the system 100. By way of example and not limitation, the control software 114 may control operation of the valves 108, process tools 110, handling hardware 112, and load lock 116. Each of these hardware items may have a proprietary or open programming interface, and the control software 114 may also, or instead, manage communications with these hardware items, such as by interpreting data from the hardware or providing control signals to the hardware. At a more abstract level, the control software 114 may coordinate the various components of the system 100 to schedule processing of one or more wafers 104, such as by coordinating and controlling operations of the load lock 116 and handling system 112 to move a wafer 104 into the system 100 and into one of the process tools 110. The control software 114 may also provide an external programmatic interface for controlling the entire system 100, and may also, or instead, provide information to a fabrication-wide computer infrastructure, such as event logs, status information, and the like. As will be described in greater detail below, the control software 114 may employ a neural network to calculate weights for a finite state machine that controls process scheduling. As will also be described in greater detail below, the control software 114 may use data from or provide data to a wafer-centric database. The control software 114 may also provide a graphical user interface for user interaction with the system 100 and related process data. More generally, the control software 114 may support any software functions associated with status, monitoring, maintenance, evaluation, programming, control, and/or operation of the system 100, whether with respect to particular devices, the system 100, or a fabrication facility of which the system 100 forms a part.

The load lock 116 may include any device or combination of devices that operate to control access to a vacuum or other controlled interior environment 118 maintained for the handling hardware 112 and process tools 110. It will be appreciated that, while a single load lock 116 is depicted, the system 100 may include multiple load locks 116, such as an exit load lock opposite the first load lock 116 (i.e., at the bottom of FIG. 1), one or more mid-entry load locks 116, and the like. The load lock 116 may include multiple shelves for batch wafer operations, heating/cooling systems, sensors to detect, e.g., wafer position, temperature, and the like, and any other systems or sub-systems useful for handling and/or temporary storage of wafers in transit between the interior environment 118 and an exterior environment. The load lock may include vacuum pumps, vents, gas supplies, slot valves, and any other hardware useful for handling wafers in this context. It will be further appreciated that the load lock 116 may expose the interior environment 118 directly to an external environment such as a clean room, or may be coupled to an equipment front end module, unified pod handler, or the like to transition single wafers or groups of wafers between the interior environment 118 and other areas of a fabrication facility.

It will be appreciated that the description of the system 100 is purposefully generic. A semiconductor processing system may include a wide array of hardware, sensors and the like, all of which may be controlled or used by the control software 114 to achieve desired wafer processing. For example, although four process tools 110 are depicted, it will be understood that fewer or more tools 110 may be employed, and each tool 110 may be a single tool, a process module, a cluster tool, stacked process modules, batch processing modules, and so forth. Further, while a linear arrangement is depicted, any suitable layout of tools 110 and handling hardware 112 may be usefully employed according to a particular process design. Further, tools such as aligners, robots, carts, tracks, elevators, and the like may be employed, along with sensors (such as pressure sensors, optical sensors, contamination sensors, etc.), timers, switches, valves, actuators, relays, motors, and so forth, may be suitably employed to control or monitor processes. All such variations are intended to fall within the scope of the system 100 described herein.

In more complex processing scenarios, the system 100 may process multiple wafers concurrently. Thus a first wafer may be introduced and moved by the handling hardware 112 to a process tool 110 and, while the first wafer is being processed, receive a second wafer which may be moved to a different process tool 110. Additional wafers may be introduced, and/or one of the wafers within the interior environment 118 may be moved among the various process tools 110. Thus, any number of wafers may be concurrently handled and/or processed consistent with the physical capabilities of the system 100.

Figure 2:
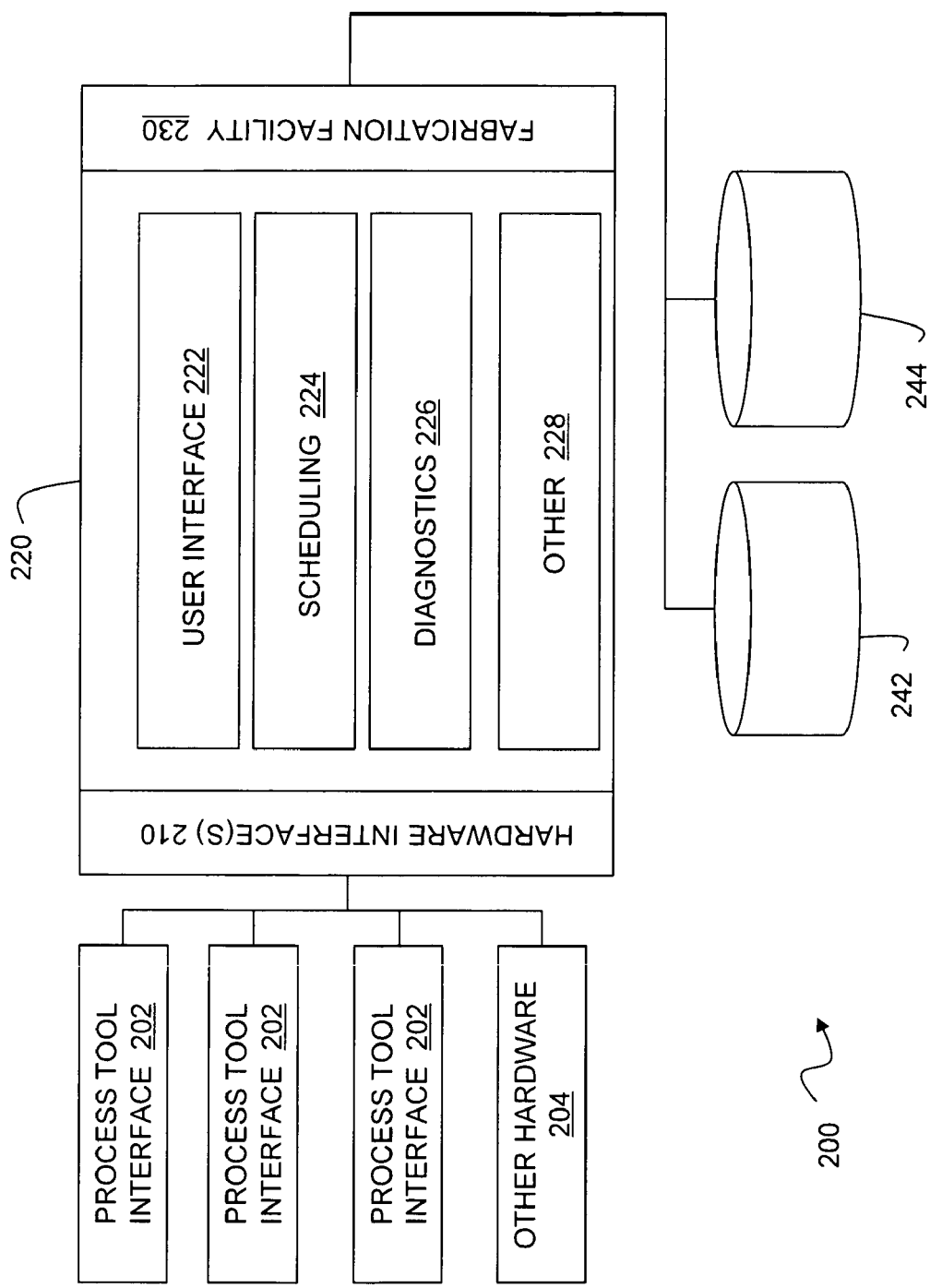
FIG. 2 shows a high-level software architecture for controlling operation of a semiconductor processing system.

FIG. 2 shows a high-level software architecture for controlling operation of a semiconductor processing system. In general, the software 200 may include a number of process tool interfaces 202, other hardware interfaces 210, a controller 220 including a hardware interface 210 for integrating communications with the foregoing, a user interface component 222, a scheduling/control component 224, a diagnostics component 226, and a fabrication facility interface 230, and one or more databases maintained for facility-wide use, such as a wafer database 242, and a records database 244. It will be appreciated that the foregoing software components and the arrangement thereof as depicted in FIG. 2 has been generalized to facilitate discussion of the more specific systems described below, and that numerous variations are possible.

The process tool interfaces 202 may be programming interfaces resident on process tools, process modules, cluster tools, or the like.

Interfaces to other hardware 204 may include physical interfaces (e.g., wire leads or a wireless network connection) or programmatic interfaces to any other hardware useful in a semiconductor manufacturing process. This may include, for example, interfaces to robots, carts, elevators, aligners, slot valves, pumps, vents, heaters, coolers, electrically controlled grippers, and so forth. This may also include sensor interfaces such as outputs from thermometers, optical sensors, pressure sensors, gas detectors, voltmeters, ohmmeters, robotic drive encoders, and so forth.

The controller 220 may be an integrated controller for a processing system, such as the system 100 described above. The controller 220 may be embodied on a computer or workstation located physically near the system, or may be embodied in a remote computer located in a control room or other computer facility, or may be integrated into a fabrication-wide software system.

The hardware interface 210 may provide an consistent internal interface for the controller 220 to exercise programmatic control over inputs and outputs for the hardware described above.

Within the controller 220, the user interface component 222 may provide a user interface for human control and monitoring of operation of the system 100. The user interface, which is described below in greater detail, may include graphics, animation, simulations, manual control, recipe selection, performance statistics, and any other inputs or outputs useful for human control of the system 100. It will be appreciated that a wide variety of interface techniques are known and may be usefully employed to provide a graphical user interface as described below. This includes network-oriented interface technologies such as web server technologies, as well as application-oriented interface technologies. Unless otherwise specified or clear from the context, all such technologies may be suitably employed with the systems and methods described herein.

The scheduling component 224 processes recipes for wafers within the system 100. This may include scheduling of movements among process tools, as well as processing within particular process tools. The scheduling component may receive recipes in any suitable machine readable form, and may create corresponding control signals for the system 100. During execution, the control signals may be communicated to system components through the hardware interface 210. Recipes and other system control instructions may be received from a remote location such as a central fabrication control system through the fabrication facility interface 230, or may be entered locally at a computer device that operates the controller 220.

Scheduling may be controlled in a number of different ways. For example, the scheduling component 224 may employ state machines and neural networks as described in greater detail below. However, numerous other scheduling techniques are known in the art for minimizing or reducing processing time and cost, many of which may be usefully employed with the systems and methods described herein. For example, the system may employ rule-based scheduling, route-based scheduling, state-based scheduling, neural network-based scheduling, and so forth.

In one embodiment, the scheduling component 224 may permit selection of one or more of these various scheduling models to control operation of the system 100. This may be presented, for example, as a user-selectable option in a user interface such as the interface described below. Once a scheduling technique is selected, a user may be prompted for any inputs such as rules, process steps, time constraints, and so forth. In other embodiments, the selection of a scheduling technique controlled by the controller 220 based upon, for example, optimization or other analysis of hardware connected to the hardware interface 210 and/or any recipes scheduled for execution. Computerized selection of scheduling techniques may employ the creation and/or evaluation of one or more processing metrics such as an estimation of processing resources required, fault tolerance, throughput, or any other useful criteria with which automated selections of scheduling techniques may be objectively compared. In embodiments, the scheduling component 224 may employ multiple scheduling techniques concurrently. While one example of this is the neural-network-weighted state machine described below, it will be appreciated that numerous other combinations may be usefully employed. For example, the scheduling component 224 may use a state machine to control robotics, while rule-based scheduling is employed to control and optimize use of process tools. All such variations are intended to fall within the scope of this disclosure.

The diagnostics component 226 may monitor operation of the system 100. This may include tracking scheduled maintenance as well as monitoring operation of the system to identify hardware failures and to determine, where possible, when failures are becoming more likely based upon current operation. One useful hardware diagnostics system is described, for example, in U.S. application Ser. No. 11/302,563, incorporated by reference herein. The diagnostics component 226 may also monitor software performance using, for example, the "black box" techniques described below.

Other components 228 may include any other useful modules, executable files, routines, processes, or other software components useful in operating the controller 220, and more generally, in controlling operation of a semiconductor manufacturing system 100 as described herein. This may include, for example, device drivers for controlling operation of hardware through the hardware interface 210. This may also include database management software, communications protocols, and any other useful software components.

The controller 220 may include a fabrication facility interface 230 that may provide an interface to other users within a fabrication facility. This may include a number of different types of interfaces. For example, the fabrication facility interface 230 may include a programmatic interface that facilitates remote operation and control of the controller 220. The interface 230 may also, or instead, include a web server for remote, web-based access to programs, data, and status information relating to the system 100. The interface 230 may also, or instead, include interfaces to other shared computing resources within a fabrication facility such as the wafer database 242 and the records database 244.

The wafer database 242 may provide wafer-specific data as described in greater detail below. This may include any useful data for a wafer such as current temperature, historical temperature(s), particle maps, and so forth. While depicted as a shared resource within a facility, it will be understood that the wafer database 242 may also, or instead, include a database on the device hosting the controller 220. In such cases, the fabrication facility 230 would preferably include an external interface to wafer data stored by the controller.

The records database 244 may store any information useful outside the scope of the controller 220. This may include, for example event logs and the like from the controller 220 as well as maintenance records and schedules (such as for robots and process tools), processing recipes, user manuals, technical specifications, data schemas, programming guides, and any other data relevant to the semiconductor manufacturing system 100 or the software 200.

As noted above, the foregoing description is generalized to facilitate discussion of more specific software systems disclosed herein. Unless otherwise indicated, the specific software components identified in FIG. 2 may reside in a single device or multiple devices, and may be centralized or distributed. Thus for example, the process tool interfaces 202 may be programming interfaces resident on associated process tools, and may be accessed through the hardware interface 210 of the controller 220 for use in, e.g., scheduling or display. Alternatively, a process tool may not provide a programming interface, but may consist of physical connections controlled through one or more drivers in the hardware interface 210. All such variations that may suitably employed in a software architecture for controlling a semiconductor fabrication facility are intended to fall within the scope of this disclosure.

It will be appreciated that the systems and methods described herein may be realized in hardware, software, or any combination of these suitable for a particular application. The hardware may include a general purpose computer and/or dedicated computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device that may be configured to process electronic signals. It will further be appreciated that the process may be realized as computer executable code created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software. At the same time, processing may be distributed across a number of different computing devices in a number of ways, or all of the functionality may be integrated into a dedicated, standalone controller or other hardware. All such permutations and combinations are intended to fall within the scope of the present disclosure.

Figure 3:
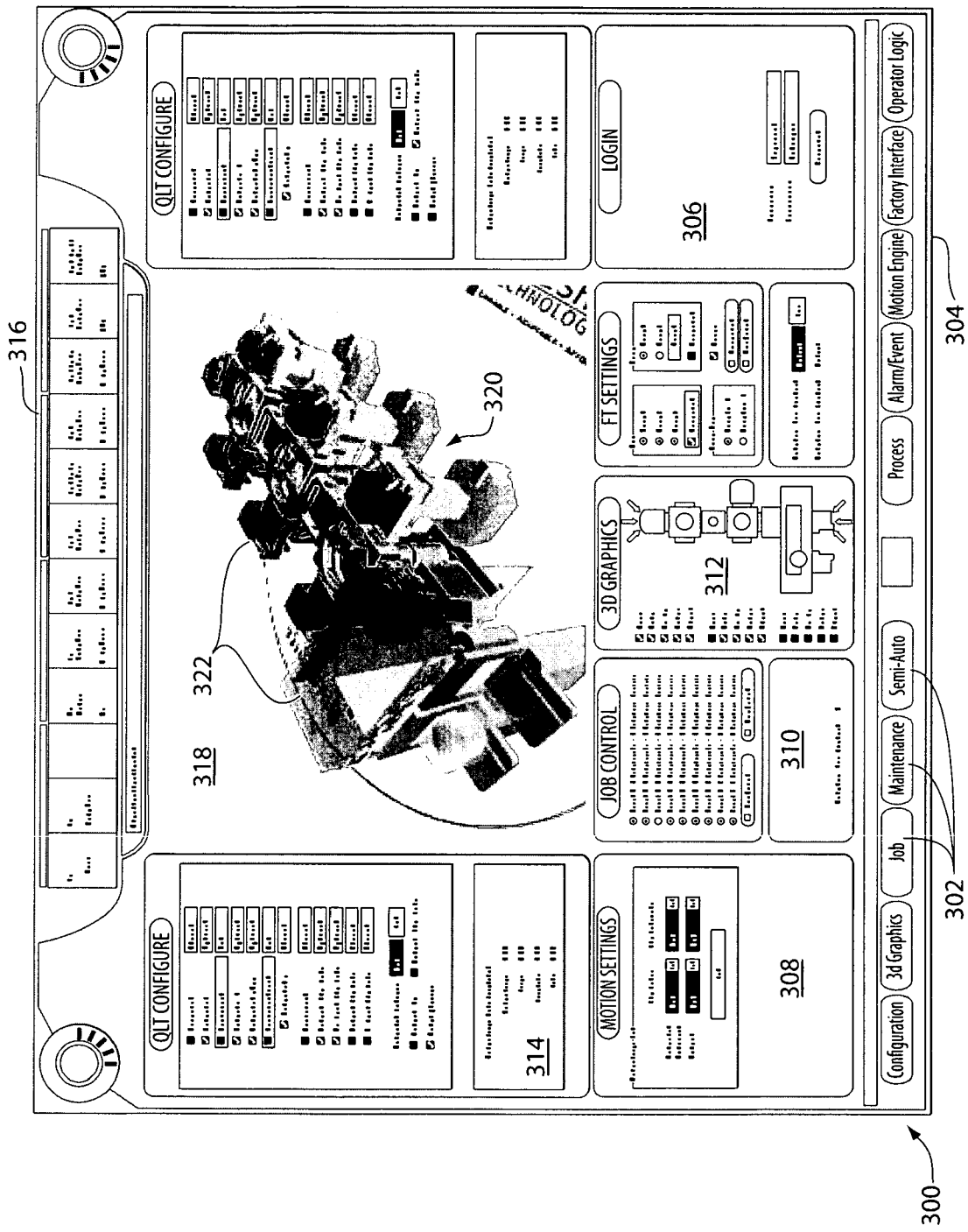
FIG. 3 shows a graphical user interface for human monitoring and control of a semiconductor processing system.

FIG. 3 shows a graphical user interface for human monitoring and control of a semiconductor processing system. The interface 300 may include a variety of functional areas each accessible using for example a number of buttons 302 on a menu bar 304. The functional areas may include configuration, 3D graphics, job control, maintenance, process control, motion engine, factory interface, and operator login, and so forth. Each button may open a window or a pane within the interface 300 that provides user inputs and display related to the corresponding functional area. A number of examples are provided below.

By way of example and not limitation, a number of functional areas suitable for use in a semiconductor processing controller are now described. A login pane 306 may provide text input fields for inputting a user name and password, either for authenticating a user to the controller 220 described above, or for authenticating the controller 220 to a fabrication-wide software system. A motion settings pane 308 may provide text or numeric input fields for receiving user parameters for motion such as maximum acceleration for a robotic arm with and/or without a wafer. A job control pane 310 may provide for user selection of wafer processing jobs, using radio buttons, file browsing, scroll lists, drop down lists, or any other input control. The job control pane 310 may also, or instead, provide job execution controls such as start, stop, store, and edit so that a user may control execution of selected jobs. A 3D graphics pane 312 may provide for user control over 3D visualization parameters such as selection of which system hardware is displayed, whether display is opaque or transparent, color of display, selection of perspective for rendering, and so forth. A configuration pane 314 may provide for manual control and/or setup of system components. For example, using the configuration pane 314, a user may manually open and close slot valves, vents, and so forth. The configuration pane 314 may also permit a user to save a configuration associated with a job, or with a power up of the system. A status bar 316 may provide real time display of operating parameters such as pressure, position, temperature, or the like as measured at various points within the system 100. It will be understood that real time is an inherently flexible term that depends substantially on the context in which it is applied. In general, "real time" implies an operational deadline from an event to a system response. One common metric for real time processing in industrial controls is 20 milliseconds—a minimum time base for a wide array of control hardware. Thus, in this context, substantially real time refers to about 20 milliseconds or less, while near-real time refers to an interval not significantly greater than 20 milliseconds.

A 3D graphics pane 318 may display a three-dimensional simulation of a semiconductor workpiece handling system which may include, for example, the system 100 described above. The three-dimensional simulation may include a real-time simulation based upon concurrent operation of a physical semiconductor workpiece handling system. For example, an operating system may gather data from sensors, robot drive encoders, pressure gauges, and the like, and use this acquired data to drive an inverse kinematics or other simulation engine that simulates the system. The displayed hardware 320 may contain 3D renderings of each hardware item including, for example, equipment front end modules, front opening unified pod loaders, wafer cassettes, wafers, process modules, robot drives, robotic arms, end effectors, isolation valves, heating stations, cooling stations, aligners, load locks, vacuum pumps, metrology devices, sensors, and any other hardware. It will be understood that, in the context of describing the graphics pane, a hardware item may include hardware that forms the processing system, as well as items handled by the system (e.g., cassettes, wafers, and other workpieces) and utilities such as gas, electricity, and the like used by the system. One or more hardware items 322, which may include any of the hardware noted above, may include a link contained within an area of the pane 318 where the hardware item 322 is displayed or resides.

One or more controls may be provided for user navigation within the graphics pane 318. This may permit rotation, translation, zoom, pan, and the like so that a user may control what portion of the simulation is to be viewed, and how closely and from what perspective the simulation is to be viewed.

Each link for a hardware item may be a hyperlink that is accessible to a user by a mouse over or point and click operation within the pane 318 in the area where the hardware item 322 resides. The hyperlink may provide access to information related to the hardware item including, for example, a status of the hardware item 322 or technical information for the hardware item 322. Certain items, such as status may be usefully obtained locally by the controller 220 through direct access to process tools and other sensors. On the other hand, other items such a maintenance records or technical documents may be more conveniently stored at a central repository for use throughout a fabrication facility. Technical information may include, for example, a list of replacement parts for a hardware item (which may be further hyperlinked to inventory, procurements, etc.), a user manual for the hardware item, a maintenance schedule for the hardware item, a maintenance log for the hardware item. Status information may include, for example, sensor data or diagnostic information (such as a performance evaluation, an expected time to failure, a maintenance alert, and an operating condition alert). Where the hardware item is a wafer, the status information may also include any of the data described below that might be stored in a wafer-centric database including without limitation particle maps, estimated temperature, wafer center location, a wafer process history, a recipe, and so forth. Where an alert is created, such as overheating of a system component, a pop-up or other window may be created for the hardware item without user activation.

Information accessed through the links may be displayed in a number of fashions. For example, the information may be displayed in a new window, or a new pane within the user interface 300. The information may be displayed in a pop-up window within the pane 318, such as a callout or the like extending from the selected hardware item.

Figure 4:
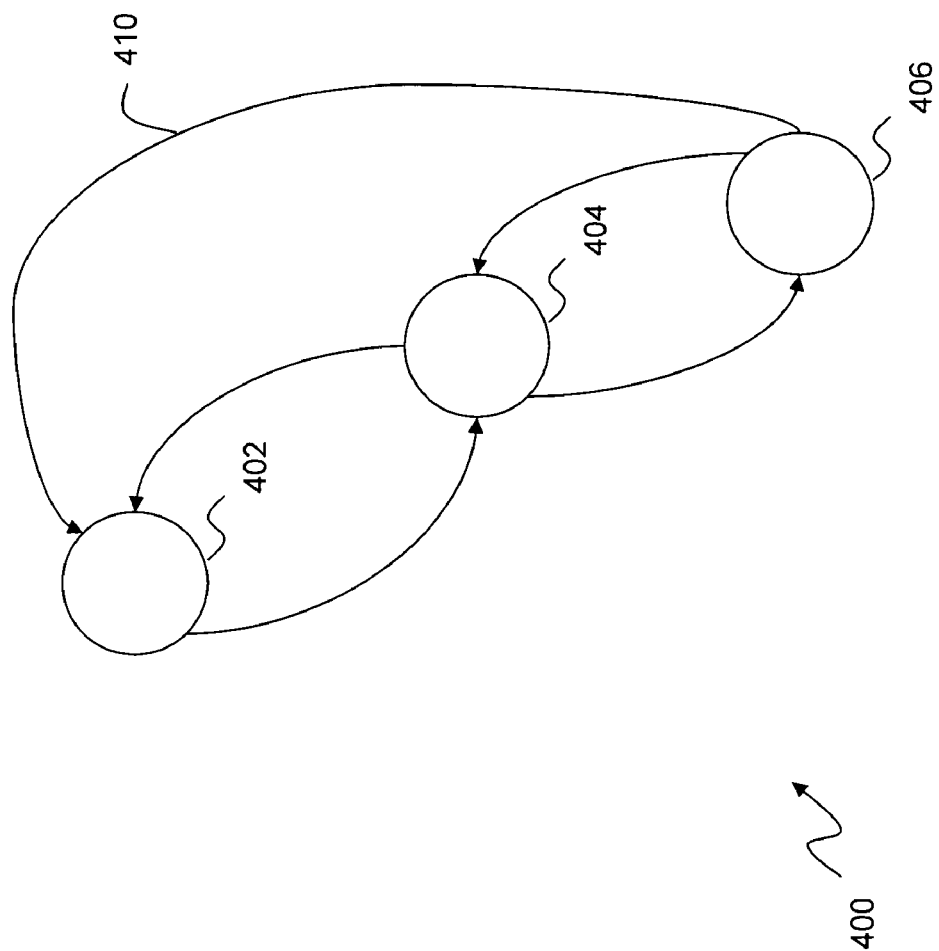
FIG. 4 shows a finite state machine.

FIG. 4 shows a state machine. It will be appreciated that the state machine 400 of FIG. 4 is a highly simplified state machine, and that state machines used for real time control of a semiconductor manufacturing process would typically be significantly more complex, having significantly more states and transitions than illustrated in FIG. 4.

A state machine 400 may include a number of states including a first state 402, a second state 404, and a third state 406. The states may represent, for example, the states of an isolation valve (e.g., open or closed), positions of a robotic arm (e.g., location x, y, z, etc.), status of a buffer station, or any other state or combination of states in a semiconductor manufacturing process. Each change from one state to another state occurs through a transition, such as a first transition 410. It will be noted that each state may have one or more transitions into and out of that state. This may be, for example, a control signal or a sensor output that triggers a response by an item of hardware to transition to a different state.

It will be understood that while a simple finite state machine 400 is depicted in FIG. 4, numerous other techniques can be employed to represent state machines. For example, a state machine may be fully represented by a state table that relates states and conditions in tabular form. In addition, various conceptual state machines use different models. For example, certain state machine models define binary conditions for transitions while others permit more generalized expressions for evaluating state changes. A so-called Moore machine has outputs that depend only on the current state, while a Mealy machine has state outputs that depend on an input and the state. Other commonly used representations for software implementations of state machines include algorithmic state machines, Unified Modeling Language ("UML") state diagrams, directed graphs, and so forth. These and other state machine modeling techniques may be usefully employed to characterize and control a semiconductor manufacturing process.

Figure 5:
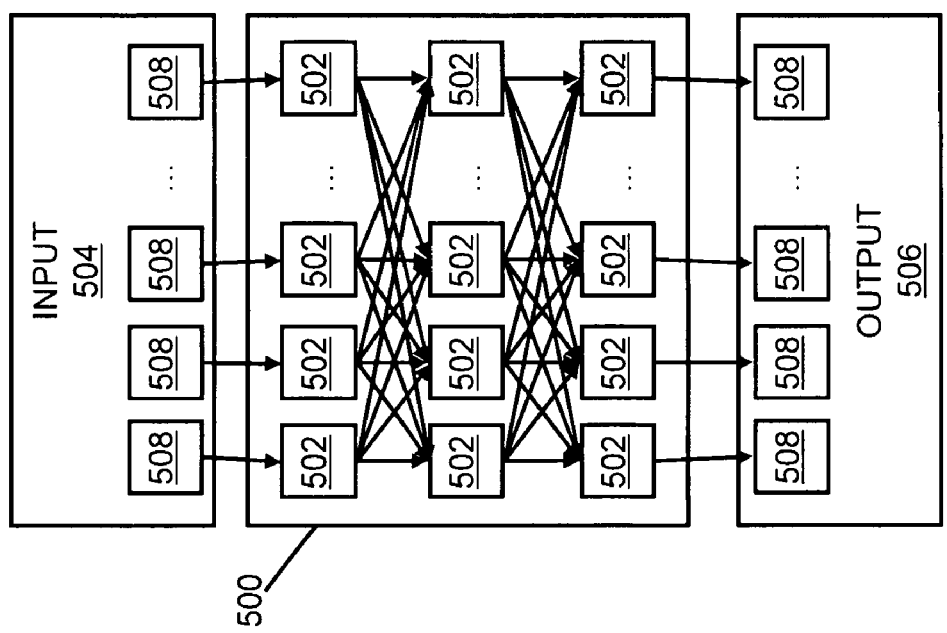
FIG. 5 shows a neural network.

FIG. 5 shows a neural network 500. It will be understood that the neural network 500 depicted in FIG. 5 is a generalized representation, and that the size and depth of a neural network 500 used to control a semiconductor fabrication process may vary significantly from this depiction.

The network 500 may include, for example, a three-layer network of objects 502. An input 504 may be applied to one of the objects 502 at the top level of the network 500 (e.g., the "input layer") and an output 506 may be produced by one of the objects 502 at the output layer. Each of the objects 502 in this network 500 may contain any number of artificial neurons and objects as will be described in greater detail below. In general, there may be any number of objects 502 in the input layer, output layer, and middle layer. The number of objects 502 at the input layer 504 may correspond to the number of components 508 of the input 504 (which may be a vector or the like) and the number of objects 508 at the output layer 506 may correspond to the number of components 508 in a target value vector, which is an output 506 used to train the network 500. Each component 508 may be a real value. The number of objects 502 in the middle layer may be, for example, the average number of objects 502 in the input and output layers. Each object 502 in one layer of the network may be fully connected to objects 502 of the adjacent layer or layers. In this way, the output from each and every object 502 in the input layer is provided as an input to each and every object 502 in the middle layer. Likewise, the output from each and every object 502 in the output layer of the middle layer is provided as an input to each and every object 502 of the output layer.

A process for creating the neural network 100 typically involves creating an array of objects 502. As described below, each object 502 may further have the ability to clone itself based on any useful process metric or other objective criteria. For example, a useful criterion may be derived from a physical and/or theoretical understanding of an environment, such as the processing time required to evaluate an input 504 to the network 500 based upon available processing resources. This criterion may have particular use where the neural network 500 is intended for use in real time control, thus imposing constraints such as completion of processing within 20 milliseconds or some other real time control time increment. In other words, where a system requires action within a known time interval, the network 500 may be configured to automatically add or remove objects (e.g., nodes) in order to ensure completion of any evaluation within the known interval, or alternatively to improve the likelihood of completion within the known interval. Thus where possible, the network 500 may automatically provide finer grained processing to more accurately represent the modeled environment.

The neural network 500 may be implemented according to an object-oriented programming paradigm. Within this, the objects 502 may be capable of propagating or cloning themselves according to one or more predetermined conditions. These actions may be conducted autonomously, by the individual objects 502. Thus the neural network 500 may reconfigure itself without manual intervention. In embodiments, the objects 502 may be represented in an array data structure, which may include singly-or doubly-linked lists that represent the tree structure or hierarchy of the neural network 500. The neural network 500 may include any number of tiers or layers. The objects 502 may be software objects as expressed in an object-oriented language or any other computer language. More generally, numerous programming techniques are known in the art for designing and implementing neural networks in software, and all such techniques may be suitably adapted to use with the systems and methods described herein, particularly techniques suitable for use in a real time control environment. It will be appreciated that the term "neural network" as used herein may refer to a conventional neural network or to a neural network that employs self-cloning nodes as described in greater detail below.

Figure 6:
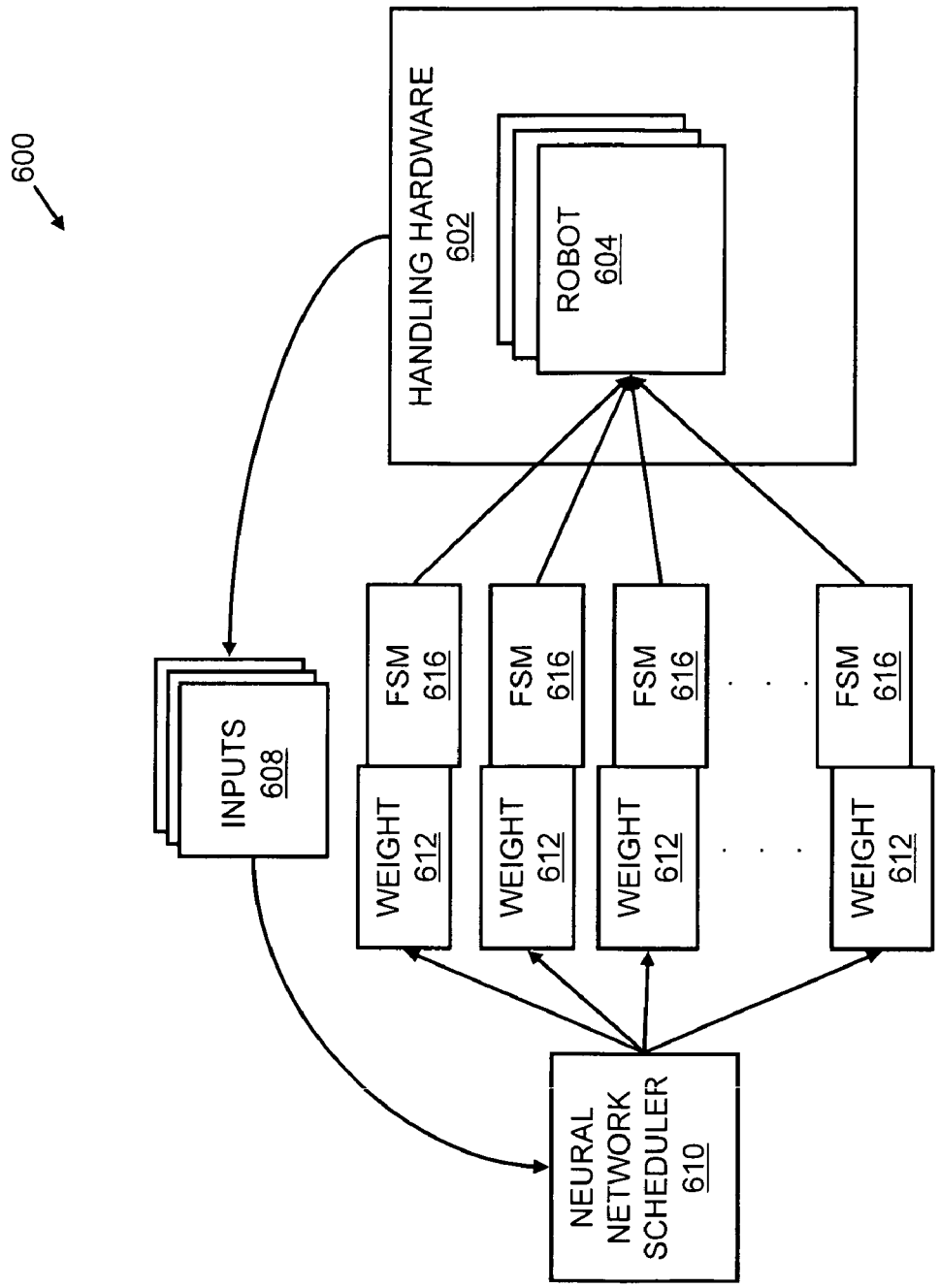
FIG. 6 shows a neural network providing weights to a finite state machine.

FIG. 6 shows a neural network providing weights to a finite state machine. In this control system 600, handling hardware 602 includes a plurality of robots 604, such as any of the hardware and robots described above. In general operation, output from the handling hardware 602 provides inputs 608 to a neural network scheduler 610. The scheduler in turn calculates weights 612 for one or more states 614 of a finite state machine. These states, in turn, provide control signals to the robots 604 and any other handling hardware 602.

The inputs 608 to the neural network scheduler 610 may include any data derived from the handling hardware 602, such as sensor data from optical sensors, pressure gauges, switches, and so forth. The inputs 608 may also, or instead, include robotic data such as encoder data that indicates positions of a robotic drive or the robotic components attached thereto. The inputs 608 may also, or instead, include processed sensor data. For example, a switch may detect whether a slot valve is open or closed (and optionally, in transition), and the switch output signal may be converted into a Boolean representation of the valve status. For example, an optical sensor and optical source may work together to provide an optical beam that is periodically broken by the passage of a wafer there between. This data may be processed to capture the time of a transition from wafer presence to wafer absence (or, conversely, wafer absence to wafer presence), and the transition type and time may be provided as an input 608. In other embodiments, this sensor data may be further processed to calculate a center of a wafer, and wafer center coordinates may be provided as the inputs 608. Similarly, robot encoder data may be provided in raw form to the neural network scheduler 610, or may be converted into physically meaningful values such as x, y, and z coordinates of an end effector. The inputs 608 to the neural network scheduler may relate to a wide variety of system information such as a pick time, a valve status (such as and without limitation open, closed, opening, closing, unknown, and so forth), a transition time (such as and without limitation, the time it takes to pump a load lock down to vacuum or up to atmosphere), and so forth. More generally, the inputs 608 may be any raw or processed data available from the handling hardware 602.

At the same time, it will be understood that the inputs 608 may assume many forms. For example, the inputs 608 may include vectors, real numbers, complex numbers, or the like. The data may be represented as integers, floating point values, or any other numerical representation suitable for use with the neural network scheduler 610. The inputs 608 may be synchronous (i.e., a single vector provided at regular time intervals) or asynchronous 608 (i.e., with signals arriving at various times from various hardware items within the handling hardware 602).

The neural network scheduler 610 may include any of the neural networks described above. In general, the neural network scheduler 610 operates to process inputs 608 and calculate weights 612 used by a finite state machine. The neural network scheduler 610 may drive calculations as far down a neural network as possible given a time constraint and a finite computing resource with which to process the neural network. So, for example, the scheduler 610 may be dynamically adapted to update consistent with real time scheduling, or may be statically designed to ensure completion of calculations in time for real time control, according to the hardware and software platform supporting the scheduler 610. Relative to the robots 604 and the handling hardware 602, the neural network scheduler 610 may work off-line, updating the weights 612 from time to time as the robots 604 are more or less continuously operating based upon the finite state machine 616 and transitions therein having the highest weight 612 at the time.

The states 616 of the finite state machine may employ any current value of the weights 612 to determine whether a transition is appropriate, and generate any suitable control signals to the robots 604 and other handling hardware 602. It will be understood that the state machine may employ multiple concurrent states, or the system 600 may include multiple state machines (i.e., one state machine for each item of hardware, or for discrete groups of hardware), or the system may employ states with multiple outputs. While state machine modeling techniques are generally conceived to permit full description of any system, certain techniques may be more convenient for describing the handling hardware 602 described herein. Thus it will be appreciated that while any state machine design and programming techniques may be used, certain techniques may be advantageously employed in the context of real time control of semiconductor fabrication and handling systems. The use of state machines to control semiconductor manufacturing hardware, and more generally the use of state machines in industrial control, are well known in the art.

Figure 7:
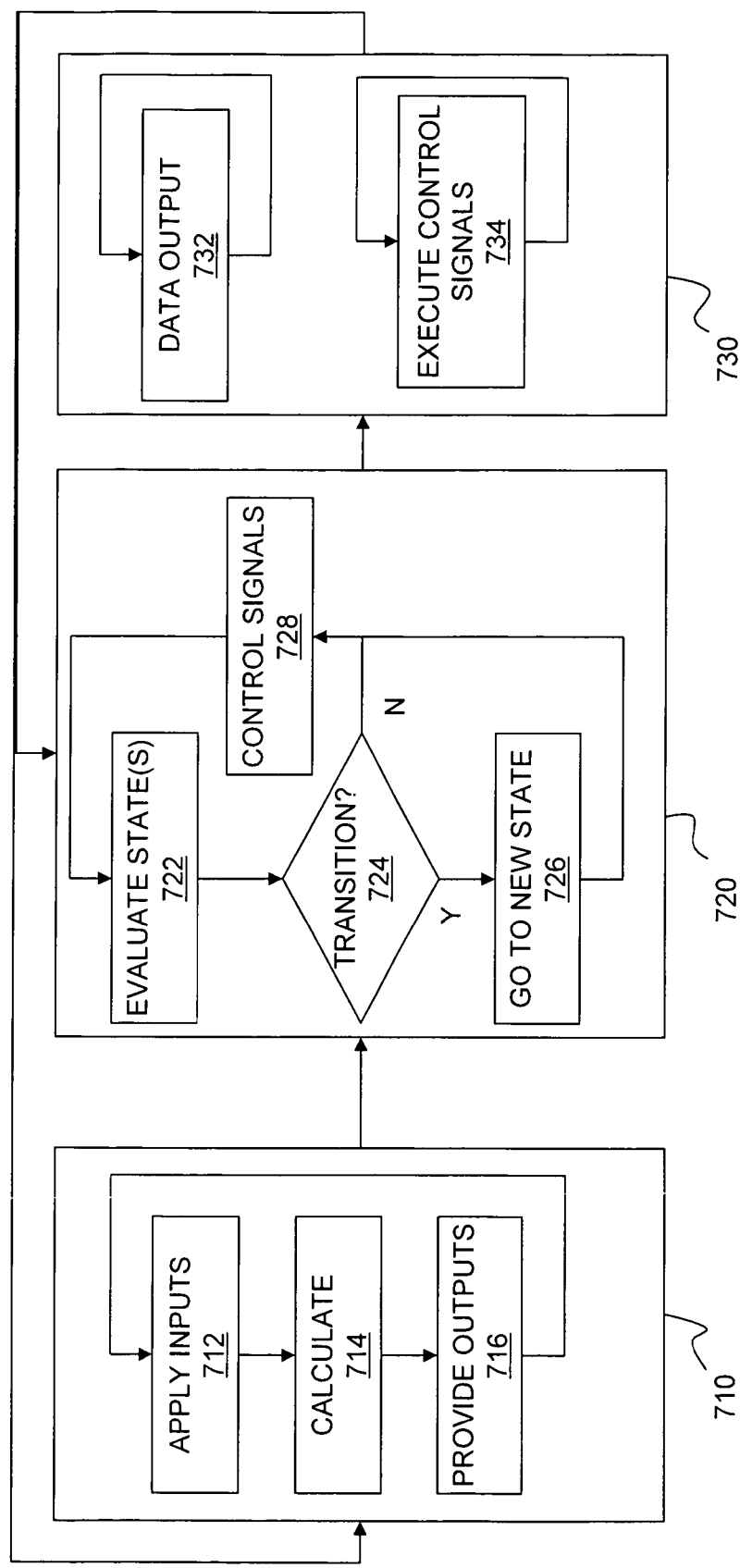
FIG. 7 shows a process for controlling a semiconductor processing system with a finite state machine and a neural network.

FIG. 7 shows a process for controlling a semiconductor processing system with a finite state machine and a neural network.

A neural network 710 receives data from a semiconductor manufacturing system 730. These inputs are applied to the neural network 710 as shown in step 712. The neural network 710 then processes nodes as shown in step 714 to calculate outputs as shown in step 716. The outputs may be weights for transitions of a state machine 720. As noted above, a wide array of neural network and corresponding computing techniques may be employed. Where real time control or near real time control is desired, the neural network 710 may be constrained so that updated outputs are provided within a predetermined time interval, such as every 20 milliseconds.

A finite state machine 720 evaluates current states 722 to determine whether to transition to another state as shown in step 724, using the weights provided as outputs from the neural network 710. If a transition is appropriate, the finite state machine 720 proceeds to a new state as shown in step 726 and generates corresponding control signals 728 for output to the system 730. If a transition is not appropriate, the finite state machine may return to re-evaluate the current state 722, with corresponding control signals created as outputs to the system 730. It will be appreciated that in control of the system 730, states and transitions may each have numerous output control signals associated therewith. In a real time system, the control signals 728 may be updated at a predetermined time interval such as every 20 milliseconds. It will be noted that the state machine 720 may employ outputs from the neural network as well as physical data output from the system 730.

As noted above, numerous state machine architectures may be employed with the systems described herein. For example, the weights may be values for conditional transitions. These weights may represent physical quantities conditionally applied to transitions such as time, position, pressure, and so forth. Thus a state may conditionally transition to another state when pressure in a process tool interior chamber is below a threshold, with the threshold represented by a weight from the neural network. Similarly, the weights may represent Boolean values and/or expressions, as well as sensor data or any other scalar or vector quantities. In other embodiments, the weights may represent values assigned to a number of possible transitions from a state. In such embodiments, remaining in the current state may have a weight of 0.4, transitioning to another state may have a weight of 0.39, and transitioning to a third state may have a weight of 0.21. In this state, the state machine will remain in the current state indefinitely. However, if the weight of the current state drops to 0.35 and the weight of one of the other states rises to 0.4, then a transition will be initiated in the next processing cycle.

In another embodiment, each state may have a number of possible transitions arranged as, for example, a stack or linked list of items each having one or more conditions for initiating a transition. The neural network 710 may be employed to reorder the conditions according to an evaluation of the inputs from the system 730, or to shift the linked list of items, so that one of the conditions is evaluated first. In such a system, the neural network 710 may also reprioritize each condition independently and/or may add or remove conditions and/or may alter values used to evaluate each condition.

The semiconductor manufacturing system 730 may receive the control signals created by the state machine 720 in step 728. As generally depicted in FIG. 7, the system 730 may execute control signals continuously (step 734), and may generate data output continuously (step 732). It will be appreciated that the timing for these steps may be continuous or periodic and synchronous or asynchronous according to the hardware and sensors employed by the system 730.

As a significant advantage the general architecture described above can separate processing that re-evaluates or reconfigures the state machine from the actual operation of the state machine. Thus, for example, the state machine may operate without input from the neural network indefinitely, providing conditional and/or unconditional transitions among states according to inputs from the physical system and generating corresponding control signals at any time interval suitable or desirable for controlling the system 730. At the same time, the neural network 710 may expend any appropriate amount of processing resources (e.g., by processing the neural network 710 to any suitable depth) without requiring an update at the same time interval as the state machine 720. In other words, the neural network 710 may fully evaluate outputs even where the processing time extends over many time increments of the finite state machine. The neural network 710 may also, or instead, curtail processing to provide updated outputs at each time increment of the state machine, at every other time increment of the state machine, or at any other suitable interval.

It will be appreciated that the foregoing description shows a neural network based scheduling system at a high level. It will also be understood that that other techniques may be employed to modify a state machine asynchronously. For example, the state machine may be reconfigured using heuristic techniques, rule-based techniques, look up tables, and/or any other processing techniques provided they do not prevent the state machine from continuing to provide substantially real time control of the system 730. These and numerous other variations and modifications to the process 700 will be readily appreciated by one of ordinary skill in the art and are intended to fall within the scope of this disclosure.

Figure 8:
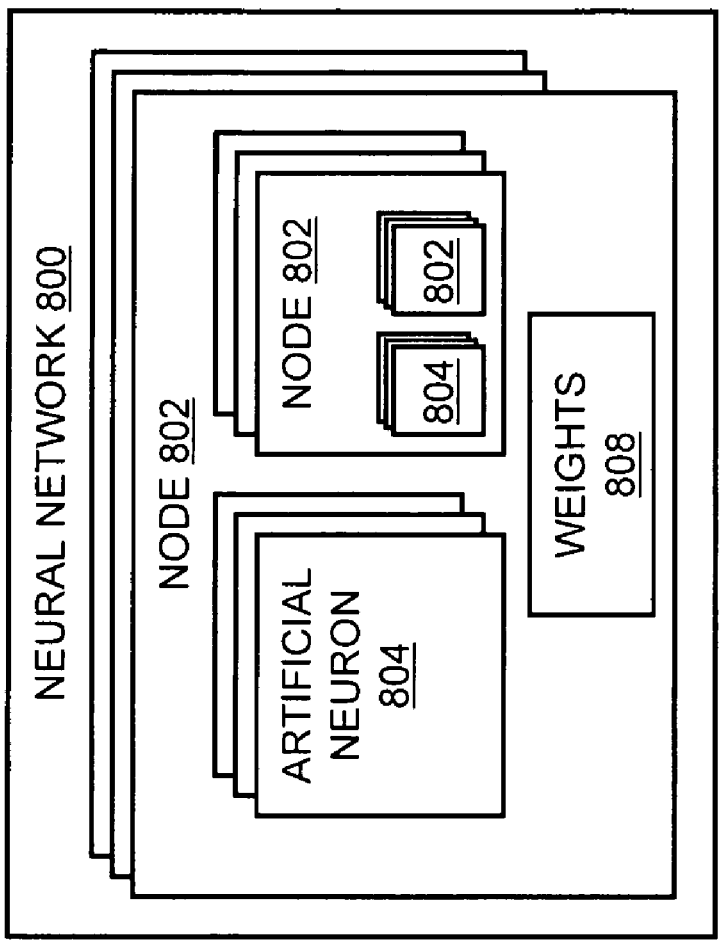
FIG. 8 is a functional block diagram of a self-propagating object in a neural network.

FIG. 8 is a functional block diagram of a self-propagating object in a neural network. In general, a self-propagating, object-based neural network 800 may include a plurality of nodes 802, each containing a neuron 804, an output or weight 808, and one or more other nodes 802.

Each node 802 may be implemented, for example, as an object in an object-oriented environment. As shown, any of the nodes 802 may contain other nodes 802, which may recursively include similar objects.

The artificial neuron 804 within each node 802 may provide conventional functionality of a neuron within the neural network 800, with one or more outputs of the neuron 804 represented as weights 808. The neuron 804 may be embodied in any implementation of artificial neurons useful for programmatic implementation of a neural network, including without limitation a perceptron, a sigmoid unit, a linear unit, and so forth. Both the artificial neurons 804 and the nodes 802 of a particular node 802 may be arranged together in a network such as a directed, undirected, cyclic, and/or acyclic graph; a map; a mesh; and so forth. In one embodiment, these nodes 802 are arranged in an acyclic, directed graph. In any case, an output from one artificial neuron 804 at a node 802 may be the input to one or more other artificial neurons 804 at one or more other nodes 802. The set of weights 808 may comprise an ordered set of real values used to control a state machine as generally described above.

In embodiments, the nodes 802 may be object-oriented nodes implemented on a single, uniprocessor computer; a plurality of uniprocessor computers; a single, multiprocessor computer; a plurality of multiprocessor computers; and so forth. The neural network 800 may provide a parallel computation of an input vector to an output vector across a plurality of nodes 802. The nodes may be evaluated or calculated using an algorithm; a heuristic; an approximation; an optimization; a gradient descent; a stochastic approximation of gradient descent; backpropagation with or without momentum, weight decay, and/or any other techniques suitable for evaluating a neural network. Execution of the evaluation may operate in parallel or sequentially, locally on one computer or distributed across a plurality of computers. The architecture may employ multi-threading, multi-tasking, distributed computing, batch computing, timeshare computing, remote procedure calls, client-server computing, peer-to-peer computing, SIMD computing, MIMD computing, SISD computing, MISD computing, a service-oriented architecture, an n-tier architecture, a monolithic software architecture, a modular software architecture, and so forth. More generally, any suitable computing techniques may be employed to evaluate the neural network 800 and calculate output values such as weights 808 there from.

Generally, the neural network 800 may accept an input, process the input according to a feedforward computational mechanism, and produce a result. Both the input and the output may be a vector of real values. Generally, the input value may be drawn from training data, validation data, or application data. The training data and the validation data may comprise inputs associated with desired outputs, which may be referred to as "target values." These target values may be generated by a target function. The application data may comprise inputs but not target values. The training data and validation data may be used during a training process that prepares the neural network 800 for use in an application. The application data may be the inputs that the neural network 800 receives during operating of, e.g., a wafer fabrication process.

An output of the neural network, or a node thereof, may conform to an approximation of the target function of the input. In an embodiment, the output is computed by providing an input to the neural network 800 and applying a feedforward algorithm to the network 800. In accordance with object-oriented programming principles, a parent node 102 may apply the feedforward algorithm to its artificial neuron(s) 804 and may request of its child nodes 802 that they do the same, such as via a method invocation on each of the objects representing a child node 802. This process may continue recursively as the child nodes 802 apply the feedforward algorithm to their artificial neurons and request of their child nodes 802 that they do the same. After this process fully resolves a final output is produced.

The output or weights 808 may be compared with a target value. The difference between the output and the target value may be referred to as an error and the function that calculates the error may be referred to as an error function. In the preferred embodiment, the error function calculates a mathematic difference between the output (which may be a vector) and the target value (which may also be a vector). When the output equals the target value, the error has zero magnitude signifying a correct, target output. In such cases, the neural network 800 encompasses a perfect approximation of a target function for that input.

Creating a useful neural network 800 involves a training process. This process may subject the network 800 to an input selected from the training data and then adjust the network 800 according to any resulting error(s). The general objective of this training process is to adjust the neural network 800 so that it forms a good approximation of the target function with respect to all possible inputs selected from the domain of application data. In other words, a goal of the training process may be to adjust the neural network 800 so that the error is minimized, if not zero, with respect to any and all inputs drawn from any and all sets of application data. The training process may employ a backpropagation algorithm for adjusting the network 800 based upon the error. It will be appreciated that a neural network may be usefully trained without knowing or articulating the target function that relates inputs to outputs.

Those skilled in the art will appreciate that any function can be approximated with arbitrary accuracy by a neural network 800 composed of three layers of artificial neurons 804 arranged in an acyclic, directed graph with the bottommost layer (often referred to as the "output layer") of neurons 804 encompassing linear units and the two other layers of neurons 804 encompassing sigmoid units. However, it will also be appreciated that the number of neurons 804 required in each of these levels is not generally known. One possible result of not having enough neurons 804 in a layer is an inability of the network 800 to approximate the target function with enough accuracy for a given application. Conversely, increasing the number of neurons 804 in a layer will increase the computational complexity associated with the training process. Moreover, the number of neurons 804 required in a layer can increase exponentially with the number of inputs to the network 800. Furthermore, greater numbers of neurons 804 may be more prone to overfitting a set of training data.

As a significant advantage, implementing the nodes of a neural network, array declarations for the neural network can be significantly smaller. As another advantage, each object may encapsulate the ability to adapt to processing or training demands by adding or removing related nodes. This latter aspect is discussed in greater detail below.

In one aspect, one or more nodes 802 may include an autonomous ability to create or remove child nodes. An algorithm, heuristic, or other automatic process may determine when a node 802 should clone itself. For example and without limitation, such a process may recognize that the node 802 is of insufficient complexity to process its inputs, such as where unsatisfactory training results are observed based upon some objective criterion or criteria for the error function. Similarly, a node 802 may eliminate related nodes where evaluation of the network 800 takes too long or uses excessive processing resources. In any case, the process of cloning may involve copying the node 802, spawning a new object based upon the node 802, adding one or more nodes 802 as children, adding one or more additional artificial neurons 804 within the node 802, and so forth. These newly created objects or neurons may receive as input a value from an environment, from the parent node 802, or from any other child nodes 802 that may have been created due to the cloning process. The cloned nodes 802 may adapt in response to their inputs using any suitable techniques including, perhaps as directed by an algorithm, heuristic, or other automatic process. Similarly, a node 802 may be removed from the neural network 800 in response to the determination of an algorithm, heuristic, or other automatic process.

In this manner, the neural network 800 may tend toward adequate but not excessive nodes 802 for approximating a target function within a predetermined error.

Figure 9:
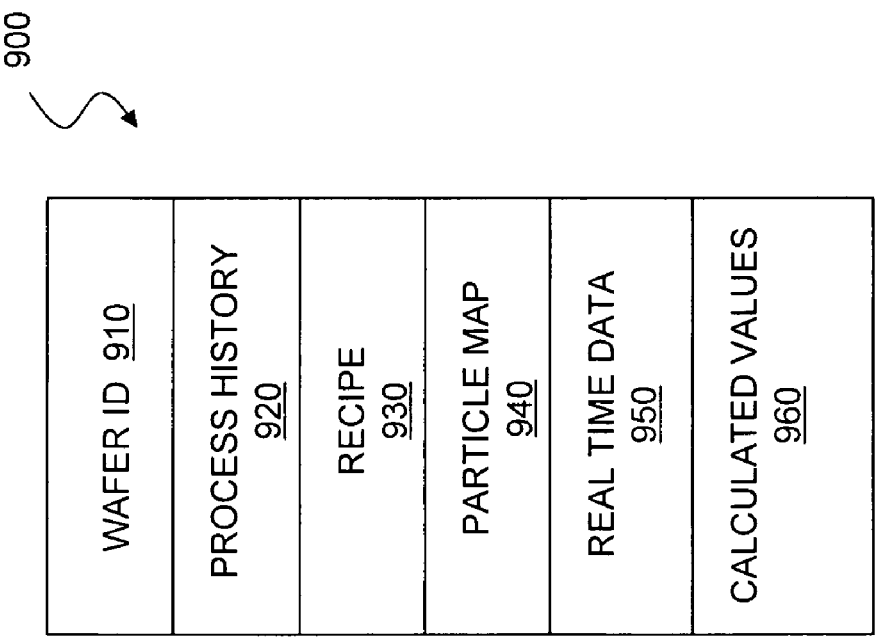
FIG. 9 shows a data structure for wafer-centric data handling.

FIG. 9 shows a data structure 900 for storing wafer-specific data. The data structure 900 may generally include a wafer identifier 910, a process history 920, a recipe 930, a particle map 940, real time data 950, and estimated values 960.

The data structure 900 may be implemented as an XML database, a relational database, an object-relational database, or any other database or data structure suitable for storing information as described herein. The data structure 900 may be embodied in a volatile memory such as memory allocated for execution of a control program, or in non-volatile memory such as a fabrication facility data repository, or some combination of these. Storing wafer data in a single data structure may provide significant advantages including easier access to wafer-specific data and greater portability of data for a wafer, including for example the data described below.

The data structure 900 may include a wafer identifier 910 that identifies and/or describes the wafer. This may include a number or other code that uniquely identifies the wafer either globally or within a particular fabrication facility, wafer lot, or other appropriate context. The wafer identifier 910 may also include descriptive data such as a wafer owner, chip type, wafer specifications and so forth. In one aspect, the wafer identifier may serve as a primary index for a wafer-centric database that contains data on a number of wafers.

The data structure 900 may include a process history 920 that contains an event log, recipes, process steps, and the like for a wafer. Thus a full or partial history of a wafer may be stored in the data structure 900 for subsequent review or archiving.

The data structure 900 may include a recipe 930 for processing the wafer. This may be a current or prospective recipe applicable to a particular wafer. Where a wafer is one of a number of wafers intended for a batch or other group process, the recipe 930 may contain a reference to an external (from the data structure) data location that contains the recipe, so that a single recipe may be shared among a number of wafers.

The data structure 900 may include a particle map 940 that stores an image or other record of particles and/or defects on the surface of a wafer. The particle map 940 may, for example, be employed to control subsequent processing steps, and/or may be updated during inspection or other metrology of a current process. In one aspect, the particle map 940 field of the data structure 900 may contain a reference to a separate table or group of data items that contain various images and other representations of the wafer.

The data structure 900 may include real time data 950 for the wafer identified in the wafer identifier 910. This data may include a number of fields, such as in a related table, for various data types such as temperature, orientation, position, and so forth. Each row of the related table may, for example, contain an entry of a data type (e.g., temperature), data units, a value, and a time at which the real time data was acquired. In another aspect, the real time data 950 may consist of a list of measurements to which new measurements are appended.

The data structure 900 may include calculated values 960 which may be a table, group of fields, or the like that contain estimated or calculated values for the wafer. This may include, for example, actual or estimated wafer center positions as calculated from various sensor measurements within a system. As another example, this may include wafer temperature. An estimated wafer temperature may be calculated for example based upon other system information such as a previously measured wafer temperature, an amount of time since the measured temperature, thermal characteristics of the wafer (which may be simulated or otherwise physically modeled or estimated), ambient temperature information, and any other relevant information available from the system.

It will be appreciated that numerous other fields are possible, and that each field may contain a single data item, a series of data items, or a reference to a table or external data source that contains corresponding data. It will further be appreciated that the data may be embodied in an object-oriented data structure, an XML data structure, a relational database, or any other form suitable for storage and retrieval of data in fields thereof. As a significant advantage, the data structure 900 may encapsulate any relevant data for a wafer, and may be readily ported to any other environment. Thus the data structure 900 may be stored in a fabrication facility data repository where it may be used in a current process as well as any subsequent processes. The data structure 900 may be transported with the wafer to other fabrication facilities, and used by a variety of different programs to analyze the wafer including facility-wide programs to calculate yield, throughput, or the like as well as specific handling/processing systems where the wafer is to be processed. Other advantages will be clear from the foregoing, including an ability to maintain physical models of a wafer that permit more efficient and/or accurate processing decisions during a fabrication process.

Figure 10:
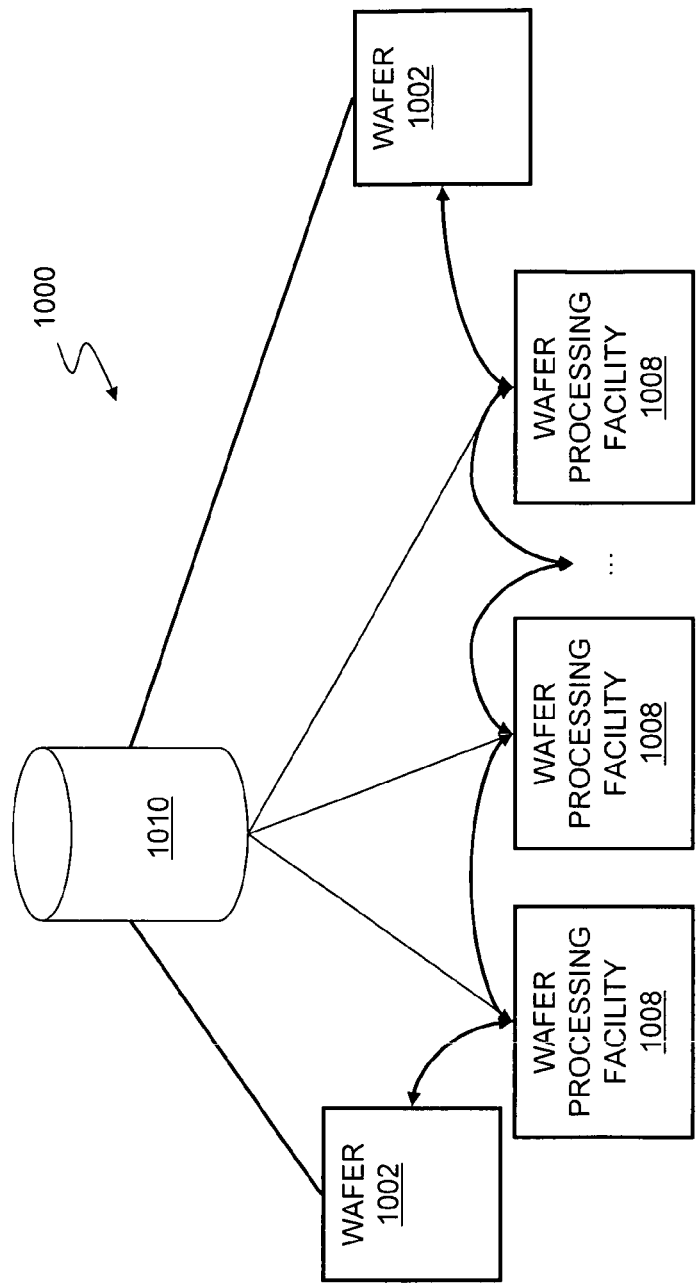
FIG. 10 shows a use of wafer-centric information to control a workpiece fabrication process.

FIG. 10 shows a use of wafer-centric information to control a workpiece fabrication process. In a system 1000, an automatic, semi-automatic, or manual process, or combinations of these, may direct a wafer 1002 through one or more wafer processing facilities 1008. Data may be gathered throughout the process and forwarded to a wafer-centric database 1010 where the data may be stored with or otherwise indexed by a data structure associated with the wafer 1002. Data such as wafer temperature, wafer position and the like may be acquired from sensors within the system 1000. In addition, data concerning process steps may be logged in the various processing facilities 1008. All of this data may be forwarded to the database 1010 and associated with other data for the wafer 1002. Aspects of this system are now described in greater detail.

Each wafer processing facility 1008 may receive data from (e.g., through a test, sample, measurement, or other metrology) and/or apply control signals to (e.g., to control a robot or processing module) the wafer 1002, which may be any of the wafers or other workpieces described above. When the wafer 1002 first enters the system 1000, the wafer 1002 may be received by a wafer processing facility 1008, and a record, object, or other data structure may be created in the database 1010. The data structure may be associated with or indexed by a unique wafer ID as described generally above. Any action or measurement performed by the wafer processing facilities 1008 on the wafer 1002 may then be recorded in the database 1010, along with any instances of related data, metadata, sensor data, and so forth. Any or all of these values, data, and metadata may be stored in the database 1010 in association with the wafer 1002. It will be appreciated that, while a linear system is depicted, the wafer 1002 may be passed from one wafer processing facility 1008 to another, in an arbitrary order that may include the wafer being received by the same wafer processing facility more than once, and all such movements may be recorded in the data structure described herein. It will further be appreciated that additional structure may be provided for the data structure in a variety of useful ways. For example, the data structure may contain a route field that itemizes each facility 1008 in which the wafer 1002 was processed, and each entry for a facility 1008 may index a table of process steps within that facility 1008. Similarly, any portion of the data structure may index other data structures in hierarchical or other fashion where appropriate for processing efficiency or design convenience.

In one aspect, the database 1010 may be maintained in real time. The database 1010 may encompass information about the state of a wafer processing facility 1008 and/or the wafer 1002 itself, the time at which the wafer arrived or departed the wafer processing facility 1008, and any other relevant data. When the wafer 1002 leaves the system 1000, the database 1002 may contain every state of the system 1000, or some subset of states or related data, that was associated with the wafer 1002 while it was in the system 1000. Where real time data for the wafer 1002 is maintained, this may be particularly useful for scheduling and control of processing.

In another aspect, the database 1010 may include fabrication data such as particle maps, yield data, or other information for the wafer 1002. More generally, data logs or other non-wafer-centric data available within a fabrication facility may be used to populate a wafer-centric database with information applicable to particular wafers. The resulting data structure may, upon completion of a process, be transferred from the system 1000 to travel with the wafer 1002, e.g., to another processing system within the fabrication facility.

Thus the database 1010 may contain data concerning where the wafer 1002 has been throughout an entire fabrication facility, and what processing has occurred at each location along with detailed data concerning the processes and any results thereof. Additionally, the data structure may contain information on prospective processing required for the wafer 1002. In one aspect, the data structure may contain an entire data log of wafer-specific data that spans numerous processing facilities 1008, storage facilities, transportation facilities, and so forth. The log may include a process log, a metrology log, a particle scan log, a temperature log, a pressure log, and so forth. Generally, the log may contain any available measurements concerning the wafer 1002 or the environment in which the wafer was processed. The database 1010 may also, or instead, contain any available information about the state of the wafer processing facilities 1008 that handled the wafer 1002.

The database 1010 may be available to a fabrication management system or a fabrication automation tool. The database 1010 may be available in (or nearly in) real time. In embodiments, the database 1010 may be stored by an SQL database management system, an XML database management system, or any other database management system or data storage system. In any case, the database may be stored offsite and away from the system 1010. As a significant advantage over data systems currently used in wafer handling facilities, the wafer-centric database may provide efficient, structured access to wafer-relevant data. While the general availability of data in a wafer-centric structure provides significant advantages by itself, the data structure may also significantly improve wafer handling and processing by enabling wafer-specific processing decisions, as described in the following examples.

Figure 11:
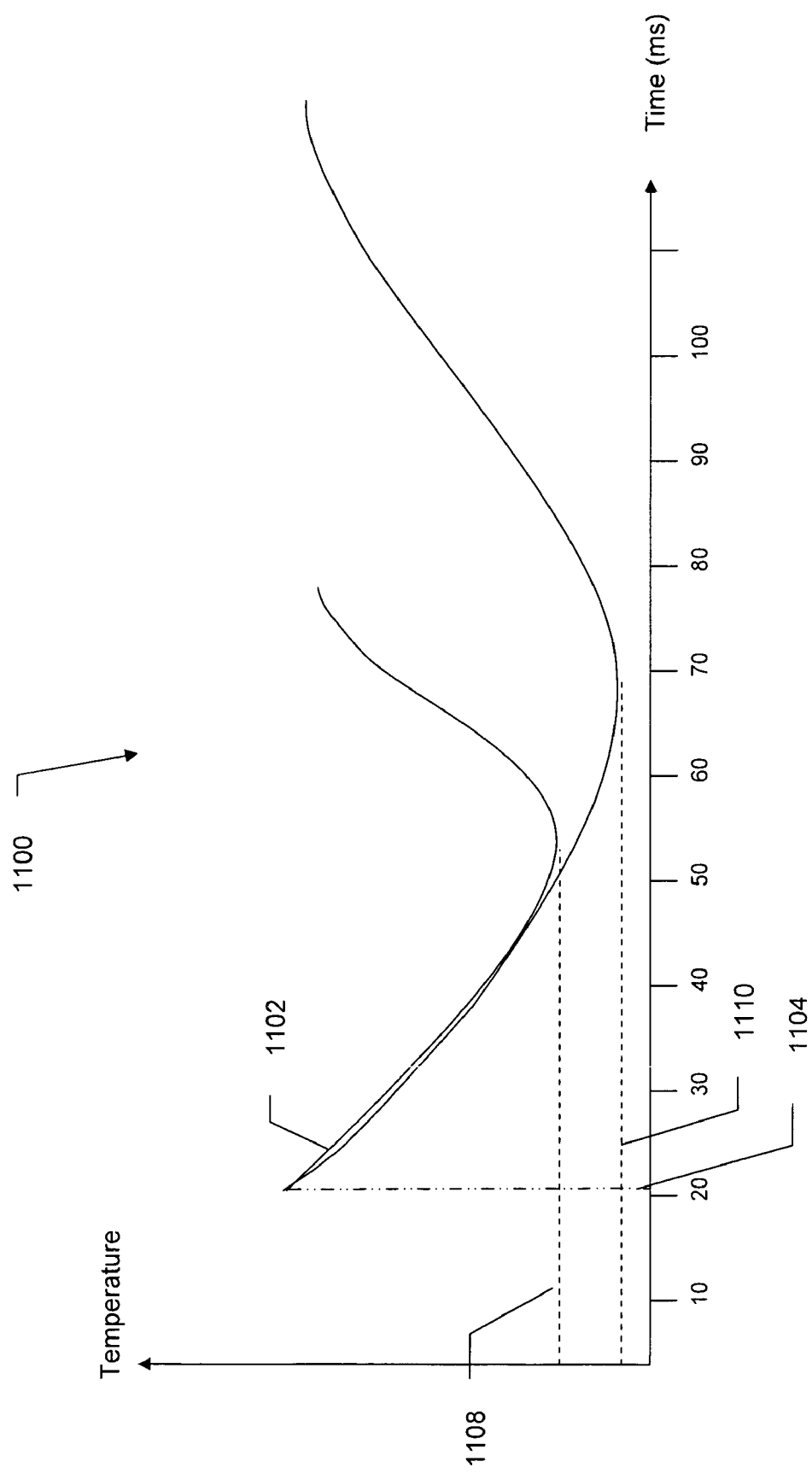
FIG. 11 shows an application of time-based wafer data stored in a wafer-centric database.

Referring to FIG. 11, information associated with a wafer, such as any of the wafers or other workpieces described above, in a wafer-centric database, such as any of the wafer-centric databases or other data structures described above, may include any time based data for the wafer, along with the current conditions of the wafer, such as wafer's temperature. By maintaining temperature data in real time, a current and historical temperature profile 1100 may be developed. The profile 1100 may be stored in a wafer-centric data structure and used by a control system in which the wafer is being processed. For example, the temperature data may be employed to optimize the amount of processing time and/or energy required for proper processing of a wafer. In an example, a wafer temperature 1102 may be detected at a time 1104 that the wafer completes a process and/or exits a process chamber. The wafer's temperature 1102 may be determined and/or estimated at various times after the process is completed. An estimation of wafer temperature 1102 may employ, for example an empirical model, a physical model, or some other model of the wafer. The model may also account for ambient temperature conditions and other aspects of the environment, such as a handler or radiant surface temperatures within a space, that might affect wafer temperature. The model may be used to determine changes in wafer temperature 1102 as a function of, e.g., time, and to calculate an estimated temperature at any decision point. Using such a model, which may update wafer data in the database on regular intervals, such as every 20 milliseconds, the wafer temperature 1102 may be known or approximated at a later stage in processing, such as when the wafer is introduced into another process module. This may spare significant processing time that might otherwise be required to ensure that a wafer is heated to a target processing temperature. For example, if the temperature of the wafer is known when it leaves a process module, the temperature may be estimated when the wafer arrives at a second process module. This information may be used along with known thermal properties of the wafer to determine how much heating or cooling is required.

A controller of a wafer processing system may use the actual or estimated wafer temperature 1102 as it prepares the a wafer for a subsequent process. By referring to a current (actual or estimated) temperature of a wafer in the wafer-centric database, the system may avoid unnecessary heating or cooling. Thus for example, where a wafer should be heated to a process temperature, the database may provide a current temperature of the wafer, based upon which an amount of additional heating may be determined. Similarly, where a wafer should be cooled, the current temperature of the wafer may be employed as an input to a cooling step in order to minimize or otherwise optimize the time and energy used to cool the wafer. Variations in wafer temperature may be the result of, for example, differences in wafer transport time or differences in process temperatures. By monitoring these variations and updating wafer-specific data, subsequent processing may be improved on a wafer-specific basis. More generally, such an approach may optimize overall throughput by optimizing processing steps based upon current data for a wafer in a wafer-centric database. The database may be updated using measurements, or estimates/models of process parameters so that an actual or estimated value for such process parameters are continuously available in real time or near real time.

In an alternate embodiment, a wafer centric database such as any of the wafer-centric data structures described above may accommodate flexible use of a wafer processing system. In general, flexibility may be enhanced by providing wafer-specific data throughout the processing of a wafer, which avoids difficulties inherent in otherwise basing decisions on wafer-specific inferences drawn from system-wide processing data. For example, a system with a plurality of processes may support processing each wafer through only the processes required to complete the wafer. In an example, a system with five processes (A,B,C,D,E) may utilize the wafer-centric database to process a first wafer through (A,C,D) while a second wafer may process through (A, B, E), and a third may use process through (B,C,D,E). A wafer-centric database 402 may allow the first wafer to be processing in (C) while the second wafer is processing in (A) while the third wafer is processing in (B). Using a wafer-centric database, it would not be necessary to reconstruct the state of, e.g., the second wafer as it transitions from process B to process E, based upon data obtained from various process logs, transport robotics, and so forth. Rather, the history of the second wafer can be obtained directly by inspection of the second wafer in the database. In addition to data concerning history and current state, the data for the second wafer may include a manifest or the like that includes instructions for subsequent processing. This data may be employed by a controller in handling the second wafer, and in coordinating the handling of other wafers in the system 408 that might be vying for handling or processing resources.

As semiconductor fabrication systems and the underlying software therefore grow more complex, it becomes increasingly difficult to monitor control software, particularly where unexpected errors occur during execution. On technique for acquiring operational data during execution of complex software is described below.

Figure 12:
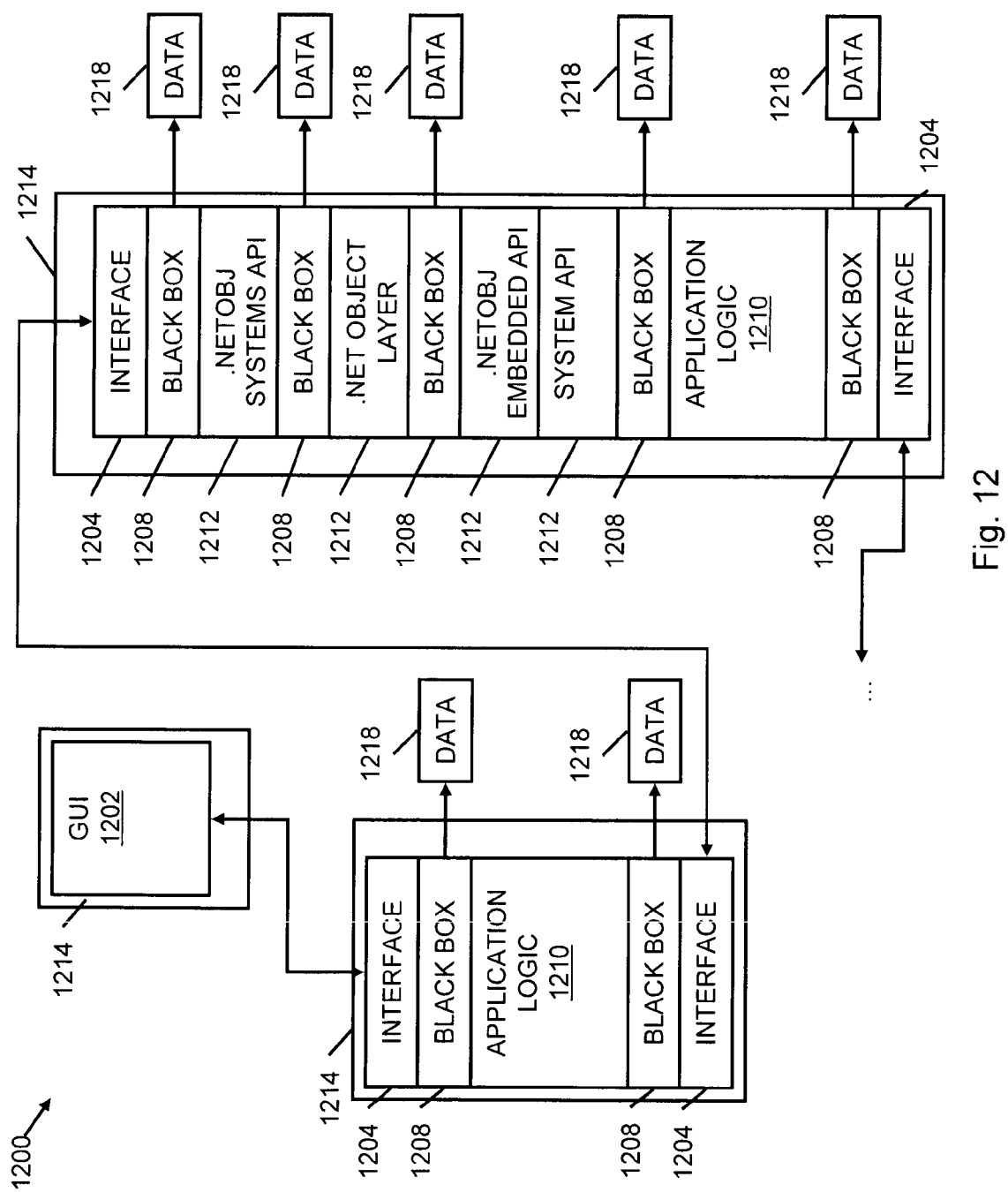
FIG. 12 shows a software system including a black box data recorder.

FIG. 12 shows a software system 1200 may include software modules, which may consist of or comprise a GUI 1202, a plurality of interfaces 1204, a plurality of black box recorders 1208, a plurality of application logics 1210, and a number of APIs 1212. The software modules may be arranged in a stack, as shown, with some modules grouped together to form one or more applications 1214. The applications 1214 may communicate via interface 1204 software modules, as shown by double-headed arrows. As depicted, there is a GUI 1202 application 1214; an application 1214 containing application logic 1210 and no APIs 1212; and an application 1214 that contains application logic 1210 and a number of APIs 1212. Ellipsis indicate that, in embodiments, an number of other applications 1214 may be present, with those applications 1214 likewise being arranged as a stack of software modules that have interfaces 1204 to provide inter-application communication. It will appreciated that the depicted arrangement is just one example taken from an uncountable set of possible arrangements of software modules 1204, 1208, 1210, 1212 and applications 1214.

The black box recorders 1208 produce data 1218. This data 1218 may encompass information about the state of the software modules. This information may relate to information that is passed between the modules and/or may relate to an internal state of a software module with which a black box 1208 recorder has contact. The information may be transparently and automatically gathered by the black box 1208 as the information is passed through the black box 1208 from one software module to another. Alternatively or additionally, a software module may provide information directly to the black box 1208, such as and without limitation in the form of an alert, an error message, a status message, or some other message related to a software module's operation. Alternatively or additionally, a black box 1208 may reach into a software module and extract information from the software module. In embodiments, this may be implemented as a method call to the software module. In embodiments, the black box software module 1208 may be implemented as an aspect in an aspect-oriented programming paradigm. In embodiments, the black box software module 1208 may be integrated into the other software modules via inheritance, a callback, a hard-coded feature, a dynamically linked library or object, a statically linked library or object, and so forth.

In embodiments, the black box software modules 1208 may contain circular queues. As information is collected by a black box 1208, it is added to a circular queue within or associated with the black box 1208. Optionally, the contents of the queue can be dumped to a log file, such as to preserve those contents from being overwritten. In embodiments, a software module, such as and without limitation a diagnostics tool may be configured to request and/or to receive the contents of the circular queue. In this way, an up-to-date snapshot of the information in the queue can be retrieved by the software module. Generally, the data 1218 that is produced by the black box encompasses some or all of the information gathered by the black box 1208. The data 1218 may be utilized to help determine an exact state of the system 1200 at any time. In some cases, this time may be associated with an unexpected event, such as and without limitation a hardware and/or software failure.

Figure 13:
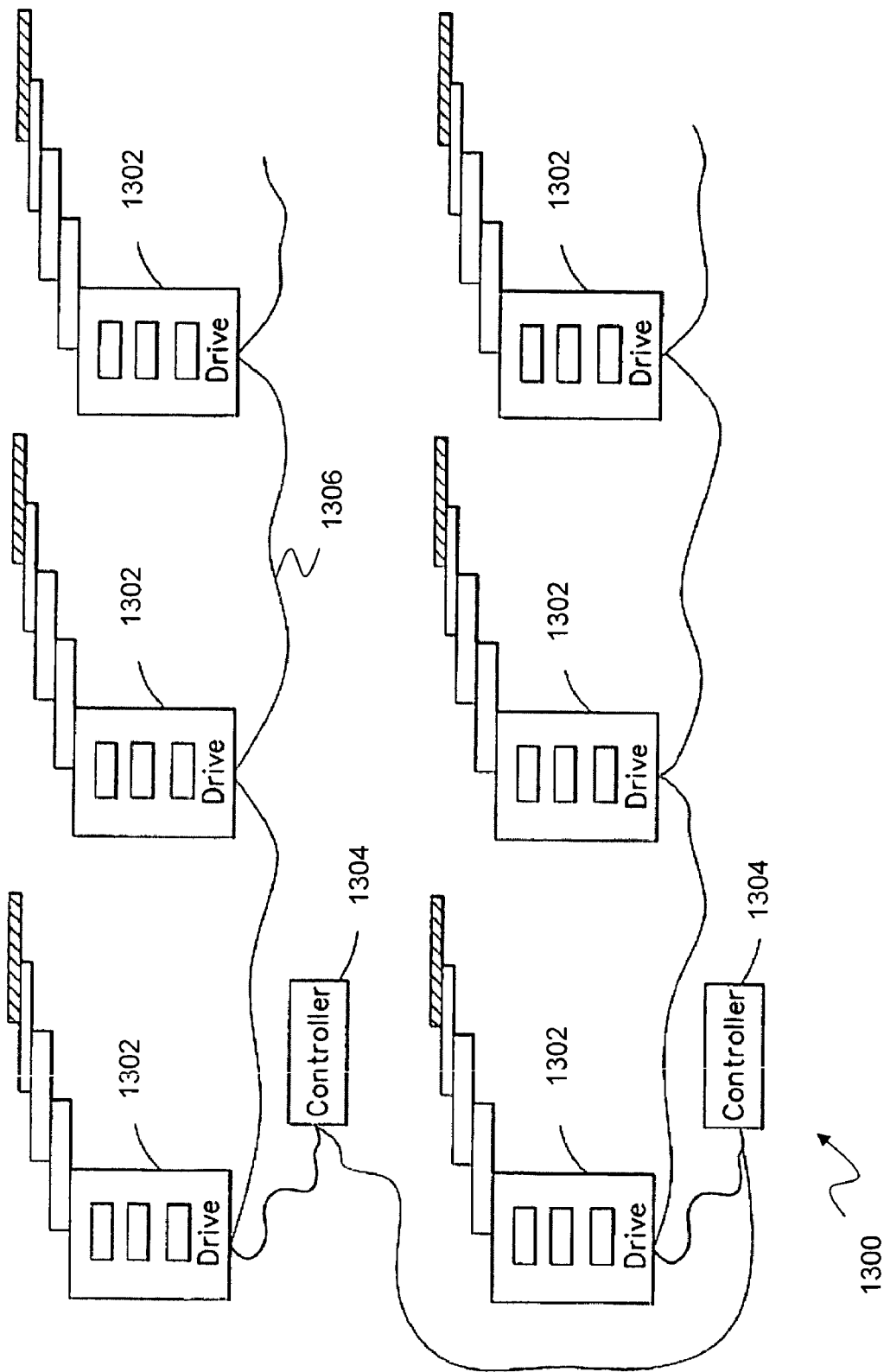
FIG. 13 shows a network for interconnecting process hardware.

FIG. 13 shows a network for interconnecting process hardware. In the system 1300, a number of controllers 1304, which may employ any of the control software and/or data structures described above, may be connected to a number of robots 1302 and other process hardware (such as slot valves, vacuum gauges, and so forth) using a shared physical medium 1306. The medium 1306 may advantageously be a pair of wires or other serial connection so that controllers and/or robots 1302 may be interconnected using a single, simple serial communications bus. Numerous protocols are known in the art and may be suitably employed for controlling communications among process hardware and controllers that share a single physical medium. The daisy-chained interconnection illustrated in FIG. 13 may also couple to sensors, valves, and the like which communicate data back to the controller(s) 1304. While a daisy-chain is one convenient technique for serially interconnecting devices, it will be understood that other techniques may be employed as well, such as wired or wireless Ethernet, either of which may share a common medium for communications.

While the invention has been described in connection with certain preferred embodiments, other embodiments that would be readily appreciated by one of ordinary skill in the art are intended to fall within the scope of this disclosure. Accordingly, the following claims should not be limited to the specific embodiments described above, but should be afforded the broadest interpretation allowable by law.

What is claimed is:

1. A system comprising:
   a state machine that controls operation of a semiconductor manufacturing system to schedule processing of one or more workpieces, the state machine including a plurality of states associated by a plurality of transitions, each one of the plurality of transitions having a weight assigned thereto, wherein when the state machine is operating within one of the plurality of states, a selection of a transition from the one of the plurality of states to another one of the plurality of states is determined by evaluating the weight assigned to each one of a number of possible transitions from the one of the plurality of states; and a plurality of sensors for sensing aspects of the semiconductor manufacturing system;

a neural network that receives as inputs data from the plurality of sensors and provides as outputs the weights for one or more of the plurality of transitions;

a graphical user interface that displays a three-dimensional model of the semiconductor manufacturing system, wherein the three-dimensional model includes one or more objects that are correlated to an inventory containing data about a physical inventory of system components, the graphical user interface being configured to graphically present the one or more of the plurality of transitions in the three-dimensional model based on the weights from the neural network output in response to the data from the plurality of sensors.

2. The system of claim 1, wherein the semiconductor manufacturing system includes a tunnel-based cart workpiece transport facility combined with a robot-robot handoff linear processing facility.

3. The system of claim 1, wherein the semiconductor manufacturing system comprises modularly assembled modules.

4. The system of claim 3, wherein at least one semiconductor manufacturing module can be added to the semiconductor manufacturing system without reconfiguring existing modules.

5. The system of claim 1, wherein processing of one or more workpieces includes at least one of heating and cooling.

6. The system of claim 1, wherein the received data includes technical information related to a process associated with the workpiece.

7. The system of claim 1, wherein the received data includes workpiece edge sensing data.

8. The system of claim 1, wherein at least one of the states represents a state of an item of hardware within the semiconductor manufacturing system.

9. The system of claim 1, wherein at least one of the states represents a position of a workpiece within the semiconductor manufacturing system.

10. The system of claim 1, wherein at least one of the states represents a position of an isolation valve within the system.

11. The system of claim 1, wherein the state machine is updated in substantially real time.

12. The system of claim 1, wherein the state machine is updated every 20 milliseconds.

13. The system of claim 1, wherein the inputs to the neural network include at least one process time for a workpiece within the semiconductor manufacturing system.

14. The system of claim 13, wherein the at least one process time includes one or more of a target duration, a start time, an end time, and an estimated end time.

15. The system of claim 1, wherein the inputs to the neural network include one or more of sensor data, temperature data, a detected workpiece position, an estimated workpiece temperature, an actual workpiece temperature, a valve state, an isolation valve state, robotic drive encoder data, robotic arm position data, end effector height data, a process time, a process status, a pick time, a place time, and a control signal.

16. A method comprising:

controlling operation of a semiconductor manufacturing system with a state machine to schedule processing of one or more workpieces, the state machine including a plurality of states associated by a plurality of transitions, each one of the plurality of transitions having a weight assigned thereto, wherein when the state machine is operating within one of the plurality of states, a selection of a transition from the one of the plurality of states to another one of the plurality of states is determined by evaluating the weight assigned to each one of a number of possible transitions from the one of the plurality of states; and sensing aspects of the semiconductor manufacturing system;

calculating, with a neural network, the weight assigned to each one of a number of possible transitions from a current state of the plurality of states by applying data representing the sensed aspects as inputs to the neural network;

selecting a transition from the current state of the plurality of states by evaluating the weight assigned to each one of the number of possible transitions from the current state; and displaying a three-dimensional model on a graphical user interface of the semiconductor manufacturing system, wherein the three-dimensional model includes one or more objects that are correlated to an inventory containing data about a physical inventory of system components, the three-dimensional model being configured to graphically present one or more of the plurality of transitions on the display based on the weights calculated by the neural network in response to applying the data representing the sensed aspects.

17. The method of claim 16, wherein at least one of the states represents a state of an item of hardware within the semiconductor manufacturing system.

18. The method of claim 16, wherein at least one of the states represents a position of a workpiece within the semiconductor manufacturing system.

19. The method of claim 16, wherein at least one of the states represents a position of an isolation valve within the system.

* * * * *